United States Patent
Ueda et al.

(10) Patent No.: US 7,130,748 B2
(45) Date of Patent: Oct. 31, 2006

(54) SIMULATION METHOD FOR ESTIMATING PERFORMANCE OF PRODUCT MADE OF VISCOELASTIC MATERIAL

(75) Inventors: Masahiko Ueda, Hyogo (JP);
Kazuyoshi Miyamoto, Hyogo (JP);
Masaki Shiraishi, Hyogo (JP)

(73) Assignee: SRI Sports Limited, Kobe (JP)

(*) Notice: Subject to any disclaimer, the term of this patent is extended or adjusted under 35 U.S.C. 154(b) by 60 days.

(21) Appl. No.: 10/481,754

(22) PCT Filed: Jul. 16, 2002

(86) PCT No.: PCT/JP02/07236

§ 371 (c)(1),
(2), (4) Date: Aug. 27, 2004

(65) Prior Publication Data
US 2005/0004779 A1    Jan. 6, 2005

(51) Int. Cl.
*G01L 1/00* (2006.01)
*G06G 7/48* (2006.01)

(52) U.S. Cl. .............. 702/42; 702/182; 703/7; 73/12.02; 73/789

(58) Field of Classification Search ............ 702/33, 702/41–43, 182; 703/2, 5, 6, 7; 73/12.01, 73/12.02, 787, 789–798, 804, 866.4
See application file for complete search history.

(56) References Cited

U.S. PATENT DOCUMENTS

| | | | | |
|---|---|---|---|---|
| 6,671,642 B1* | 12/2003 | Miyamoto et al. | ........... | 702/109 |
| 6,829,563 B1* | 12/2004 | Miyamoto et al. | ........... | 702/182 |
| 6,925,416 B1* | 8/2005 | Miyamoto et al. | ........... | 702/182 |
| 2002/0077795 A1* | 6/2002 | Woods et al. | ................. | 703/6 |
| 2005/0086034 A1* | 4/2005 | Naito et al. | .................... | 703/2 |

FOREIGN PATENT DOCUMENTS

JP          10-010027 A      1/1998

* cited by examiner

*Primary Examiner*—Marc S. Huff
*Assistant Examiner*—Manuel L. Barbee
(74) *Attorney, Agent, or Firm*—Birch, Stewart, Kolasch & Birch, LLP

(57) ABSTRACT

A simulation method includes the step of momently measuring a value of each of a strain, a strain speed, and a stress generated in the viscoelastic material, deriving time history data of a viscous drag, the strain speed and the stress, thereby deriving a relationship among the strain, the strain speed, and the viscous drag and setting the product as a product model whose performance is analyzed; inputting the relationship to the product model; and computing a stress and strain of a deviation component by using a deviation main strain and a deviation main strain speed converted from an entire coordinate system into a main strain coordinate system and a main strain speed coordinate system respectively to thereby conduct a simulation in consideration of a change of the viscous drag which occurs in dependence of a variation of the strain and the strain speed.

20 Claims, 26 Drawing Sheets

SIMULATION METHOD FOR ESTIMATING PERFORMANCE OF PRODUCT MADE OF VISCOELASTIC MATERIAL

TECHNICAL FIELD

The present invention relates to a simulation method for estimating the performance of a product composed of a viscoelastic material. More particularly, the present invention relates to a simulation method for accurately estimating the performance of the product composed of the viscoelastic material by means of a simulation.

BACKGROUND ART

A viscoelastic material represented by a macromolecular material such as rubber or elastomer is widely applied to various products such as tires, balls to be used in sports, rolls for printing machines.

In various products composed of the viscoelastic material or a metal material, to save cost and time, development of products by using a simulation are made in various industrial fields. For example, to estimate the restitution performance of a golf ball, simulation methods of actual ball-hitting tests are proposed.

In conducting the simulation, property values of a composing material of a ball measured by a viscoelastic spectrum meter for measuring the rigidity, the viscosity of the material and a tension testing machine for measuring the modulus of longitudinal elasticity (Young's modulus) thereof are used as input data in the simulation. In particular, because the viscoelastic spectrum meter measures the property values of a dynamic strain-applied specimen, the viscoelastic spectrum meter is useful for simulating products composed of the viscoelastic material.

However in measurement conducted by using the viscoelastic spectrum meter and the tension testing machine for measuring the modulus of longitudinal elasticity, a large deformation amount cannot be imparted to the specimen. Thus a maximum strain speed applied to the specimen composed of the viscoelastic material at a measuring time is as low as 0.001/s to 1.0/s and a maximum compression strain is also as low as 0.0001 to 0.02.

A product composed of the viscoelastic material may deform at a high speed and greatly owing to the influence of an external force applied thereto when it is actually used. For example, when the golf ball is hit, a maximum strain speed of a material for the golf ball is as high as 500/s to 5000/s, and a maximum compression strain thereof is as large as 0.05–0.50.

As described above, the viscoelastic spectrum meter and the tension testing machine for measuring the modulus of longitudinal elasticity are incapable of measuring the property values of the viscoelastic material in a condition equivalent to a condition where the product composed of the viscoelastic material deforms quickly and greatly when it is actually used. Thus the maximum strain speed of the viscoelastic material and its maximum compression strain measured at a simulation time are much different from those measured at the time when the product composed of it is actually used. Therefore the conventional simulation method of inputting the property value obtained by using the viscoelastic spectrum meter and the tension testing machine is incapable of accomplishing an accurate simulation by taking the property of the viscoelastic material into consideration.

That is, it is known that the deformation behavior of the viscoelastic material when an impact load is applied thereto is different from that of the viscoelastic material when a static load is applied thereto. That is, the deformation behavior of the viscoelastic material is greatly influenced by a deformation amount or a deformation speed. In particular, when a macromolecular material such as rubber and elastomer is subjected to the impact load, it deforms at a speed as high as several seconds by 10000 or several seconds by 1000 and as greatly as by several tens of percentages in a quantitative respect. There are many viscoelastic materials that deform at such a high speed and in such a large amount. To develop products efficiently, there is a demand for development of a simulation method capable of conducting an accurate simulation. More specifically, the performance of a product such as the golf ball to which an impact is applied when it is used depends on a dynamic behavior in a condition where it deforms at a high speed and greatly. The performance of the product also depends on the characteristic of the material thereof. Therefore to develop a product, it is indispensable to conduct an accurate simulation in a condition equivalent to a condition in which the product composed of the material is actually used.

Some viscoelastic materials change in its property value such as its rigidity (modulus of longitudinal elasticity and modulus of transverse elasticity) and loss coefficient in dependence on the magnitude of a strain and a strain speed when an external force such as an impact load is applied thereto. That is, the viscoelastic material is diverse in its deformation speed and deformation magnitude. Thus depending on the deformation speed and the deformation magnitude, the viscoelastic material has a property that it changes not linearly but highly nonlinearly. More specifically, as the viscoelastic material is deformed by an external force applied thereto and strained increasingly, the loop area of an S-S (strain-stress) curve increases, and the property such as the loss coefficient thereof changes in dependence on a deformation state (speed and magnitude of deformation) thereof, thus showing nonlinearity in its property. Many viscoelastic materials have a high nonlinearity in their properties. Thus there is a demand for development of a simulation method capable of simulating a product composed of such a viscoelastic material.

However there are no methods capable of accurately expressing a phenomenon that the property of the viscoelastic material, for example, its rigidity (modulus of longitudinal elasticity and modulus of transverse elasticity) and loss coefficient changes nonlinearly in a high extent in dependence on the deformation speed and deformation magnitude thereof. Simulations have been hitherto conducted on the assumption that the property value of the viscoelastic material composing the golf ball or the like hardly changes. Consequently the conventional simulation method has a disadvantage that it is incapable of correctly estimating the performance of the product composed of the viscoelastic material in an actual use. Thus to estimate the performance of the product, trial manufacture cannot but be made.

The present invention has been made in view of the above-described situation. Thus, it is an object of the present invention to accurately estimate the performance of a product composed of a viscoelastic material showing nonlinearity in its property, for example, a product composed of a viscoelastic material whose rigidity such as the modulus of longitudinal elasticity changes in dependence on a magnitude of a strain and that of a strain speed, by conducting a simulation in a condition in which the product is actually used.

DISCLOSURE OF THE INVENTION

To solve the above-described problem, according to the present invention, firstly, there is provided a simulation method of estimating performance of a product made of a viscoelastic material, comprising the steps of momently measuring a value of each of a strain, a strain speed, and a stress generated in the viscoelastic material in a measuring condition equivalent to a condition in which the product composed of the viscoelastic material is actually used; deriving time history data of a viscous drag of the viscoelastic material from time history data of each of the strain, the strain speed, and the stress and a viscoelastic model in which a viscosity of the viscoelastic material is considered, thereby deriving a relationship among the strain, the strain speed, and the viscous drag;

in estimating the performance of the product model whose performance is analyzed and made of the viscoelastic material, the product model is divided into a large number of elements, said relationship is inputted to the product model, and an analysis is executed by a finite element method in consideration of a change of the viscous drag in dependence on a variation of the strain and the strain speed; and resolving the strain and the strain speed of an entire coordinate system generated in each element into deviation components and volume components, and converting the strain and the strain speed of the deviation components from the entire coordinate system into a main strain coordinate system and a main strain speed coordinate system respectively; and determining a viscous drag for a coordinate axis of each of the main strain coordinate system and the main strain speed coordinate system by using a converted deviation main strain and a converted deviation main strain speed.

As described above, in the first invention, the strain and the strain speed measured in the condition in which the product is actually used are resolved into the deviation components and the volume components. Then by using the main strain and the main strain speed of the deviation components converted into the main strain coordinate system and the main strain speed coordinate system respectively, the viscous drag is determined for the coordinate axis of each of the main strain coordinate system and the main strain speed coordinate system in such a way that for each element, the viscous drag is variable for three components in the direction of each axis. Therefore it is possible to accomplish a correct analysis of a three-dimensional direction and for the viscoelastic material whose viscous drag changes in dependence on a deformation state (magnitude of strain and strain speed). Thus it is possible to improve the estimation precision of the simulation.

In the first invention, it is possible to accomplish the simulation of the material whose loss coefficient shows a high nonlinearity with high precision and estimate the performance of the product, assuming that the product is in an actual use state.

In the first invention, to consider the viscoelastic characteristic in the deviation components of the strain and the strain speed generated in each element in the entire coordinate system having components $\epsilon_x$, $\epsilon_y$, $\epsilon_z$, $\epsilon_{xy}$, $\epsilon_{yz}$, $\epsilon_{zx}$, the strain and the strain speed are resolved into the deviation components and the volume components. Then by using the main strain and the main strain speed of the deviation components converted into the main strain coordinate system and the main strain speed coordinate system respectively, the viscous drag is determined for the coordinate axis of each of the main strain coordinate system and the main strain speed coordinate system in such a way that for each element, the viscous drag is variable for three components in the direction of each axis. Therefore it is possible to make a correct analysis of a three-dimensional direction in consideration of the viscoelasticity of the viscoelastic material and improve the simulation precision.

To solve the above-described problem, in the invention, secondly, there is provided a simulation method of estimating performance of a product made of a viscoelastic material, comprising the steps of momently measuring a value of each of a strain, a strain speed, and a stress generated in the product made of a viscoelastic material in a measuring condition equivalent to a condition in which the product composed of the viscoelastic material is actually used; computing a plurality of different rigidities from time history data of each of the strain and the stress and deriving a correspondence relationship among the strain, the strain speed, and the rigidities; in estimating the performance of the product model made of a viscoelastic material by setting the product made of the viscoelastic material as a product model whose performance is analyzed, the product model is divided into a large number of elements, the relationship among the strain, the strain speed, and the rigidities is inputted to the product model, and an analysis is executed by a finite element method in consideration of a change of the rigidities in dependence on a variation of the strain and the strain speed; and resolving the strain and the strain speed of an entire coordinate system generated in each element into deviation components and volume components, and converting the strain and the strain speed of the deviation components from the entire coordinate system into a main strain coordinate system and a main strain speed coordinate system respectively; and determining a rigidity for a coordinate axis of each of the main strain coordinate system and the main strain speed coordinate system by using a converted deviation main strain and a converted deviation main strain speed.

As described above, in the second invention, the strain and the strain speed measured in the condition in which the product is actually used are resolved into the deviation components and the volume components. Then by using the main strain and the main strain speed of the deviation components converted into the main strain coordinate system and the main strain speed coordinate system respectively, the rigidity (modulus of longitudinal elasticity or/and modulus of transverse elasticity) is determined for the coordinate axis of each of the main strain coordinate system and the main strain speed coordinate system in such a way that for each element, the rigidity is variable for three components in the direction of each axis. Therefore it is possible to accomplish a correct analysis of a three-dimensional direction and for the viscoelastic material whose rigidity changes in dependence on a deformation state (magnitude of strain and strain speed). Thus it is possible to improve the estimation precision of the simulation.

In the second invention, it is possible to accomplish the simulation of the material whose modulus of longitudinal elasticity shows a high nonlinearity with high precision and estimate the performance of the product, assuming that the product is in an actual use state.

It is preferable to derive the time history data of the viscous drag of the viscoelastic material from the time history data of each of the strain, the strain speed, and the stress and from the viscoelastic model in which the viscosity of the viscoelastic material is considered and consider the change of the viscous drag as well as the rigidity such as the modulus of longitudinal elasticity and the modulus of transverse elasticity. By considering the change of the viscous drag as well as the rigidity such as the modulus of longitudinal elasticity and the modulus of transverse elasticity in dependence on a deformation state of the material and the change of the viscous drag, it is possible to accomplish a correct analysis of the material showing the nonlinearity.

In the second invention, to consider the viscoelastic characteristic in the deviation components of the strain and the strain speed generated in each element in the entire coordinate system having components $\epsilon_x$, $\epsilon_y$, $\epsilon_z$, $\epsilon_{xy}$, $\epsilon_{yz}$, $\epsilon_{zx}$, the strain and the strain speed are resolved into the deviation components and the volume components. Then by using the main strain and the main strain speed of the deviation components converted into the main strain coordinate system and the main strain speed coordinate system respectively, the viscous drag and the rigidity (modulus of longitudinal elasticity or/and modulus of transverse elasticity) are determined for the coordinate axis of each of the main strain coordinate system and the main strain speed coordinate system in such a way that for each element, the viscous drag and the rigidity are variable for three components in the direction of each axis. Therefore it is possible to make a correct analysis of a three-dimensional direction in consideration of the viscoelasticity of the viscoelastic material and improve the simulation precision.

To solve the above-described problem, in the invention, thirdly, there is provided a simulation method of estimating performance of a product made of a viscoelastic material, comprising the steps of momently measuring a value of each of a strain, a strain speed, and a stress generated in the product made of a viscoelastic material in a measuring condition equivalent to a condition in which the product composed of the viscoelastic material is actually used; deriving time history data of a viscous drag of the viscoelastic material separately in a strain increase state and a strain decrease state or a strain restoration state from time history data of each of the strain, the strain speed, and the stress and a viscoelastic model in which a viscosity of the viscoelastic material is considered, thereby deriving a relationship among the strain, said strain speed, and said viscous drag;

in estimating the performance of the product model whose performance is analyzed and made of the viscoelastic material, the product model is divided into a large number of elements, said relationship is inputted to the product model, and an analysis is executed by a finite element method in consideration of a difference in the viscous drag between the strain increase state and the strain decrease state or the strain restoration state; and resolving the strain and the strain speed of an entire coordinate system generated in each element into deviation components and volume components, and converting the strain and the strain speed of the deviation components from the entire coordinate system into a main strain coordinate system and a main strain speed coordinate system respectively; and determining a viscous drag different between the strain increase state and the strain decrease or the strain restoration state for a coordinate axis of each of the main strain coordinate system and the main strain speed coordinate system when strains having an equal value are generated in the viscoelastic material, by using a converted deviation main strain and a converted deviation main strain speed.

As described above, in the third invention, the strain and the strain speed measured in the condition in which the product is actually used are resolved into the deviation components and the volume components. Then by using the main strain and the main strain speed of the deviation components converted into the main strain coordinate system and the main strain speed coordinate system respectively, the viscous drag different between the strain increase state and the strain decrease or the strain restoration state is determined for the coordinate axis of each of the main strain coordinate system and the main strain speed coordinate system in such a way that for each element, the viscous drag is variable for three components in the direction of each axis, when strains having an equal value are generated. Therefore it is possible to accomplish a precise analysis in correspondence to an actual situation, namely, in dependence on the strain increase state and the strain decrease or the strain restoration state and accomplish a precise correct analysis of a three-dimensional direction. Thus it is possible to improve the estimation precision of the simulation.

In the third invention, it is possible to accomplish the simulation of the material whose loss coefficient shows a high nonlinearity with high precision and estimate the performance of the product in an assumption of the condition in which the product is actually used.

That is, the deformation state generated in the viscoelastic material can be divided into the strain increase state in which the strain increases in a compression direction and the strain restoration state in which a compression amount decreases gradually. In dependence on the strain increase state and the strain decrease state, the relationship between the strain and the strain speed varies. Therefore it is possible to accurately grasp the deformation state of an actual material by considering the two states of the strain generated in the viscoelastic material, namely, the strain increase state and the strain decrease state (or strain restoration state), determining the viscous drag by using the relationship, between the strain and the strain speed, different in the strain increase state and the strain decrease state, and deriving a viscous drag value separately in the strain increase state and the strain decrease state when strains having an equal value are generated. Therefore it is possible to express a phenomenon in which the material changes according to a deformation speed thereof and a size thereof and improve the simulation precision.

It is preferable to compute a norm which is the magnitude of a main strain for each of the elements, and compare the computed norm with a norm of a previous step in a simulation to determine that the main strain is in the increase state when the norm has increased, and to determine that the main strain is in the decrease state when the norm has decreased.

For example, a slight change in the main strain in only one direction causes the strain increase state and the strain decrease state to have large variations. However, when the main strain has magnitudes in a multi-direction, the strain increase state and the strain decrease state are not changed unless there are comparatively large variations in the main strain. Thus it is possible to enhance stability in computations.

In the third invention, to consider the viscoelastic characteristic in the deviation components of the strain and the strain speed generated in each element in the entire coordinate system having components $\epsilon_x$, $\epsilon_y$, $\epsilon_z$, $\epsilon_{xy}$, $\epsilon_{yz}$, $\epsilon_{zx}$, the strain and the strain are resolved into the deviation components and the volume components. Then by using the main strain and the main strain speed of the deviation components converted into the main strain coordinate system and the main strain speed coordinate system respectively, the viscous drag different between the strain increase state and the strain decrease state or the strain restoration state is determined for the coordinate axis of each of the main strain coordinate system and the main strain speed coordinate system in such a way that for each element, the viscous drag is variable for three components in the direction of each axis.

Therefore it is possible to make a correct analysis of a three-dimensional direction in consideration of the viscoelasticity of the viscoelastic material and improve the simulation precision.

In dependence on a case, the viscous drag is determined separately in a strain increase state of the stress and a strain decrease state thereof.

In the simulation method of the first, second, and third inventions of the present invention, the volume components mean a component expressed by $\epsilon_v=(\epsilon_x+\epsilon_y+\epsilon_z)$, and the deviation components mean components expressed by $\epsilon_{xy}'=\epsilon_{xy}/2$, $\epsilon_{yz}'=\epsilon_{yz}/2$, $\epsilon_{zx}'=\epsilon_{zx}/2$, $\epsilon_x'=\epsilon_x-\epsilon_v/3$, $\epsilon_y'=\epsilon_y-\epsilon_v/3$, and $\epsilon_z'=\epsilon_z-\epsilon_v/3$. The reason the shear component is multiplied by ½ is because a physical strain is converted.

The reason only the deviation component is converted is because the viscoelastic component of the volume component is very small and cannot be found by measurement in a current situation. That is, since the volume component has little viscoelastic component, determination is made by only the deviation component. Since from the result of the measurement, the conversion has a result in the direction of only one axis, a conversion of $\epsilon_{xy}$, $\epsilon_{yz}$, $\epsilon_{zx}$ components=0 is made. The result of measurement is used for only the three components $\epsilon_1$, $\epsilon_2$, $\epsilon_3$(three components of main strain).

The entire coordinate system means a coordinate system in which an initial configuration, namely, the configuration of a model is determined. The main strain coordinate system and the main strain speed coordinate system mean a coordinate system in which when the strain and the strain speed are converted in such a way that a shear component is zero, the entire coordinate system is converted at the same angle.

The strain (strain speed) generated in each element consists of six components. Because the property of the material measured in the condition of a high speed and a large deformation shows the property thereof in the direction of one axis, consideration for the property thereof in a shear direction is insufficient. Therefore the six components of the strain generated in each element are converted into the main strain coordinate system to determine the three components of the strain in the direction of a main axis.

That is, by making the strain in the shear direction zero, the six components ($\epsilon_x$, $\epsilon_y$, $\epsilon_z$, $\epsilon_{xy}$, $\epsilon_{yz}$, $\epsilon_{zx}$) of the entire coordinate system is reduced to three components of the strain (main strain coordinate system, $\epsilon_1$, $\epsilon_2$, $\epsilon_3$) in the direction of the main axis. Thereby without considering the shear direction, results of measurement allows evaluation of the characteristic of the viscoelastic material.

More specifically, the strain and the strain speed of the entire coordinate system generated in each element are resolved into the volume components and the deviation components in which the viscoelasticity is taken into consideration. Then the six deviation components of the resolved strain and those of the strain speed are converted from the entire coordinate system into the main strain coordinate system and the main strain speed coordinate system respectively. Thereafter three components of the deviation main strain in the main strain coordinate system and three components of the deviation main strain speed in the main strain speed coordinate system are used. Thereby the viscous drag and the rigidity (modulus of longitudinal elasticity and modulus of transverse elasticity) can be determined for each coordinate axis of each of the main strain coordinate system and the main strain speed coordinate system.

The stress of the deviation component and the strain thereof are computed by considering the viscoelasticity from the viscous drag. Thereafter the stress of the deviation component and the strain thereof are re-converted into those of the entire coordinate system. Based on the stress of the volume component and the strain thereof and the stress of the deviation component and the strain thereof, the stress and strain of each element are computed. By computing the stress and strain of each element as described above, the stress and the strain can be computed momently.

More specifically, from equations 1 and 2 shown below and by using the deviation main strain and the deviation main strain speed, the viscous drag, the rigidity (modulus of longitudinal elasticity and modulus of transverse elasticity), and the viscous drag different between the strain increase state and the strain decrease state or the strain restoration state are determined for each coordinate axis as necessary, and the stress and strain of the deviation component are computed by considering the viscoelasticity from the viscous drag.

(Equation 1)

$$E_i^{n+1} = E_i^n \exp(-\beta_i dt) - \frac{1-\exp(-\beta_i dt)}{\beta_i}\dot{\gamma}_i \qquad (1)$$

Where $E_i$: deviation main strain of an i-th element, n: step of analysis time, $\beta_i$: $\beta(\beta=E_t/\eta$, $E_t=E_{short}-E_{long}$, $\eta$: viscous drag) of the i-th element, and $\dot{\gamma}_i$: deviation main strain speed of the i-th element (Equation 2)

$$\Delta\sigma_i = F_i G_{short} \dot{\gamma}_i + 2F_i(G_{short}-G_{long})(E_i^{n+1}-E_i^n) \qquad (2)$$

where $\sigma_i$: stress of the i-th element, $F_i$: rigidity coefficient, $G_{short}$: short-term shear coefficient, and $G_{long}$: long-term shear coefficient After $\beta$ in the equations 1 and 2 and the rigidity coefficient F are computed from the experimental data, the six deviation components of the strain are updated by using the equation 1. Then the stress is computed by using the equation 2. After the main strain coordinate system and the main strain speed coordinate system are converted into the entire coordinate system, the stress is updated by using the following equation 3:

(Equation 3)

$$\sigma_{ij}=\Delta\sigma_{ij}+K\Delta\epsilon_v \qquad (3)$$

where K: modulus of elasticity of volume, $\epsilon_v$: volume strain, $\sigma_{ij}$: stress of entire coordinate system Further, by using a viscoelastic model in which the viscosity of the viscoelastic material is considered, the viscous drag, the rigidity such as the modulus of longitudinal elasticity, and the viscous drag different between the strain increase state and the strain decrease state or the strain restoration state are derived as necessary. Then the relationship among the strain, the strain speed, the viscous drag; the relationship among the strain, the strain speed, the viscous drag, and the rigidity such as the modulus of longitudinal elasticity; and the relationship among the strain, the strain speed, and the viscous drag different between the strain increase state and the strain decrease state or the strain restoration state are inputted to the product model to execute the simulation.

Therefore it is possible to accurately express the phenomenon that the value of the property of the viscoelastic material showing nonlinearly changes in dependence on its deformation speed and magnitude. Further because the value of each of the strain, the strain speed, and the stress is measured in the condition equivalent to the condition in which the product composed of the viscoelastic material is actually used, it is possible to conduct the simulation in correspondence to various deformation states of the viscoelastic material. Accordingly by the simulation, it is possible to accurately estimate the performance of the product composed of the viscoelastic material in which the relationship between the strain and the strain speed changes in dependence on a deformation state and whose property such as the loss coefficient and the modulus of longitudinal elasticity shows nonlinearity.

In the simulation method of the present invention, the value of each of the strain, the strain speed, and the stress generated in the product composed of the viscoelastic material is measured momently in a measuring condition equivalent to the condition in which the product composed of the viscoelastic material is actually used. More specifically, the measuring condition is set on the assumption of the state in which an external force is applied to the product in an actual use state and the viscoelastic material deforms. The value of each of the strain, the strain speed, and the stress generated in the viscoelastic material is measured momently in the above-described measuring condition to obtain the time history data of each of the strain, the strain speed, and the stress. Thus it is possible to obtain the information of a deformation state of the viscoelastic material, when an external force is applied to the product supposed to be in an actual use state. Thereby it is possible to correctly estimate the property of the viscoelastic material which deforms greatly and quickly by an impact load.

It is preferable to measure the value of each of the strain, the strain speed, and the stress momently in a plurality of measuring conditions. By altering the magnitude of the external force applied to the product and setting a plurality of measuring conditions, it is possible to obtain data of various patterns about the strain, the strain speed, and the stress and improve the accuracy of input values in the simulation. To obtain data of patterns as much as possible, it is preferable to measure the value of each the strain, the strain speed, and the stress from a time when the strain is generated in the viscoelastic material upon application of an external force thereto until the strain becomes approximately zero. It is also preferable to perform measurement at short intervals to conduct the simulation with high precision.

It is preferable to compose the viscoelastic model of a spring and a dashpot in view of the viscosity of the viscoelastic material. Because such a viscoelastic model simplifies the viscosity of the viscoelastic material, it is easy to consider the influence of the viscosity on a deformation state of the viscoelastic material. More specifically, a maxwell model, Voight model, and a combination of a plurality of springs and dashpots are favorable. To simplify the construction of the viscoelastic model, a two-component model is favorable. These viscoelastic material models are used in such a way that the viscous drag of the dashpot and the rigidity of the spring (modulus of longitudinal elasticity E or shear coefficient (modulus of transverse elasticity)) are variable. The shear coefficient is a property value determined by the modulus of longitudinal elasticity (Young's modulus) E and Poisson's ratio.

The time history data of the viscous drag of the viscoelastic material and the time history data of the viscous drag different between the strain increase state and the strain decrease state or the strain restoration state are derived from the time history data of each of the strain, the strain speed, and the stress and from the viscoelastic model in which the viscosity of the viscoelastic material is considered.

More specifically, the relationship among the strain, the strain speed, and the viscous drag; the relationship among the strain, the strain speed, the viscous drag, and the rigidity such as the modulus of longitudinal elasticity; the relationship among the strain, the strain speed, and the viscous drag different between the strain increase state and the strain decrease state or the strain restoration state are established as equations from the viscoelastic model. In this manner, the viscous drag is expressed as the function of the strain and the strain speed. The modulus of longitudinal elasticity of the viscoelastic material is derived in dependence on the strain and the strain speed, generated therein, obtained by the measurement. The value of the viscous drag different between the strain increase state and the strain decrease state or the strain restoration state is derived by substituting the derived modulus of longitudinal elasticity, the strain, and the strain speed into the function.

The rigidity such as the modulus of longitudinal elasticity is determined in dependence on the strain and the strain speed. The viscous drag is expressed as the relation among the strain, the strain speed, and the rigidity such as the modulus of longitudinal elasticity. The value of the viscous drag can be also derived in consideration of a change of the rigidity such as the modulus of longitudinal elasticity by substituting the strain, the strain speed, and the rigidity such as the modulus of longitudinal elasticity into the function.

Since the time history data of each of the strain, the strain speed, and the stress is obtained by the measurement, the time history data of the viscous drag corresponding to the strain and the strain speed can be obtained. As described above, the viscous drag is determined in dependence on the value of the strain and the strain speed and thus changes in correspondence to a variation of the strain and the strain speed which is made with the elapse of time.

The relationship among the strain, the strain speed, and the viscous drag; the relationship among the strain, the strain speed, the viscous drag, and the rigidity such as the modulus of longitudinal elasticity; the relationship among the strain, the strain speed, and the viscous drag different between the strain increase state and the strain decrease state or the strain restoration state are inputted to computation input data (or input data) including information of the product, composed of the viscoelastic material, set as a product model whose performance is analyzed. The computation input data also includes speeds and restriction conditions. Thereby a simulation is conducted in consideration of a change of the viscous drag and a change of the rigidity such as the modulus of longitudinal elasticity in dependence on a variation of the strain and the strain speed.

The relationship among the strain, the strain speed, and the viscous drag different between the strain increase state and the strain decrease state or the strain restoration state is inputted to the product model in computations for the simulation. More specifically, two-dimensional data of the relationship between the strain and the strain speed and the relationship between the strain and the viscous drag are inputted to the product model to perform computations. It is possible to generate three-dimensional data of the relationship among the strain, the strain speed, and the viscous drag and input the data to the product model as the function of the strain and the strain speed to perform computations.

As the two-dimensional data of the relationship between the strain and the strain speed and the relationship between the strain and the viscous drag, the strain, the strain speed, and the viscous drag corresponding to the strain as well as the strain speed and different between the strain increase state and the strain decrease state or the strain restoration state can be written as input data by using the above-described relationships. By using the above-described relationships, the strain, the strain speed, the rigidity such as the modulus of longitudinal elasticity corresponding to the strain as well as the strain speed, and the viscous drag corresponding to the strain as well as the strain speed can be written as input data.

More specifically, the strain, the strain speed, and the like are measured in a plurality of measuring conditions. Regarding each of patterns having different measuring conditions, the correspondence relationship between the strain and the strain speed is recorded from time series data of the strain and the strain speed. The value of the viscous drag and that of the rigidity corresponding to each curve are also recorded. By properly adjusting the correspondence relationship among the strain, the strain speed, and the viscous drag, the viscous drag at a given strain and a given strain speed is accurately derived to perform computations.

The more the number of measurements in different conditions of the strain and strain speed is, the more accurately the property of the viscoelastic material can be materialized. Thus it is preferable to measure the strain, the strain speed, and the like in a plurality of different measuring conditions. However the more the number of data of measurement is, the more it takes to perform computations for conducting the simulation. In the case of a strain and a strain speed not the same as the data of the strain and the strain speed measured under a predetermined measuring condition, it is preferable to compute the viscous drag and the rigidity by using an interpolation. As the interpolation, a primary interpolation is performed by using a binary value of the viscous drag or that of the modulus of longitudinal elasticity determined in dependence on a close strain and a close strain speed or an interpolation which is performed by using each of values measured in all measuring conditions. By performing such an interpolating operation, it is possible to compute the viscous drag and the modulus of longitudinal elasticity in correspondence to variations of the strain and the strain speed generated in the viscoelastic material which is made according to measuring conditions.

The simulation method of the present invention allows a correct simulation of the property and deformation behavior of the viscoelastic material showing nonlinearity in its property in the condition equivalent to the condition in which the product composed of the viscoelastic material is actually used. By using the viscoelastic model whose viscous drag and the modulus of longitudinal elasticity are determined by the value of the strain and the strain speed and computing the viscous drag, it is possible to consider the nonlinearity of the viscoelastic material which is not linear in its property but deforms according to its deformation speed and deformation magnitude.

The simulation method of the present invention is carried out by a finite element method described below.

In conducting the simulation method by the finite element method, a large number of nodal points and elements are set on the product model. That is, in estimating the property of the viscoelastic material composing the product by simulating the product by the finite element method, the rigidity (modulus of longitudinal elasticity or shear coefficient) of the spring composing the viscoelastic model is determined, and the viscous drag showing viscosity is determined by the strain and the strain speed generated in each element, as shown above. Thereby for each element, it is possible to indicate the property of the viscoelastic material in a proper condition of the strain and the strain speed. Instead of inputting the modulus of longitudinal elasticity, a shear coefficient may be inputted in relation to the Poisson's ratio. Whether the modulus of longitudinal elasticity or the shear coefficient is used depends on the specification of the program of the finite element method. The simulation method of the present invention can be also applied to the case where not Young's modulus but the shear coefficient is determined in an impact compression test.

The strain, the strain speed, and the stress are measured by a split Hopkinson rod testing machine. The split Hopkinson rod testing machine is capable of giving a high-speed and large-deformation strain to a specimen. That is, owing to the use of the split Hopkinson rod testing machine, it is possible to obtain time series data of each of the strain, the strain speed, and the stress of the viscoelastic material in a high-speed and a large-deformation condition in which the viscoelastic material deforms as high as several seconds by 10000 or several seconds by 1000 and as great as by several tens of percentages in a quantitative respect. Assuming that the measuring condition of the split Hopkinson rod testing machine is equivalent to the condition of the strain and the strain speed generated in the viscoelastic material when an impact load is applied to a product, it is possible to obtain property of the viscoelastic material corresponding to various states such as the state in which the viscoelastic material deforms very quickly and greatly. Thus by using the property measured by the split Hopkinson rod testing machine, the accuracy of the simulation can be improved.

The split Hopkinson rod testing machine is capable of measuring property of the material composing the specimen in various regions of the strain and the strain speed by only altering the collision speed of its hitting rod which applies an impact to the specimen. Therefore the split Hopkinson rod testing machine makes it possible to obtain the property of the material in various strains and strain speeds.

The split Hopkinson rod testing machine is originally used to evaluate an impact behavior of a metal material. In the present invention, the split Hopkinson rod testing machine is improved in its construction to evaluate the viscoelastic material having viscosity. The method of measuring the property of a material by using the split Hopkinson rod testing machine will be described later.

Needless to say, the property of the material may be measured by a measuring method other than the method carried out by using the split Hopkinson rod, provided that the measuring method is capable of giving a high-speed and large-deformation strain to a specimen and that the property of the material of the specimen can be measured in a measuring condition equivalent to a condition in which a product composed of the material is actually used.

When a strain, a strain speed, and a stress generated in the viscoelastic material are measured in a measuring condition equivalent to the condition in which the product composed of the viscoelastic material is actually used, a maximum value of the strain generated in the viscoelastic material is in the range of 0.05 to 0.50 and/or a maximum value of the strain speed is in the range of 500/s to 10000/s and favorably in the range of 500/s to 5000/s. The range of the maximum value of the strain and that of the strain speed are the condition of the strain and the strain speed generated when the viscoelastic material deforms at a high speed and greatly. Thus to estimate the performance of the product when it deforms at a high speed and greatly, it is preferable to use time series data of each of the strain, the strain speed, and the stress in this condition.

The viscoelastic material is used for a golf ball. The product model is a golf ball. The golf ball is a product composed of the viscoelastic material and deforms at a high speed or in a large amount upon receipt of an external force such as an impact load, when the golf ball is actually used. The state of the golf ball deforming at a high speed and in a large amount affects the performance thereof greatly. Therefore the analysis based on the simulation method of the present invention is very useful for estimating the performance of the golf ball. The simulation method is capable of estimating the performance of the golf ball with high accuracy without making a trial manufacture. Thus the simulation method allows efficient designing of the golf ball.

A phenomenon of a collision between the golf ball and a hitting object assumed to be a golf club head is simulated to estimate a behavior of the golf ball at the time of the collision. The simulation method is capable of estimating the property of the viscoelastic material composing the golf ball in a condition of a strain, a strain speed, and a stress equivalent to those generated in the viscoelastic material of the golf ball when the golf ball is actually hit with the golf club head. Therefore simulation method is capable of estimating the restitution coefficient of the golf ball and the behavior thereof such as a deformation state thereof when it is hit.

The simulation method of the present invention is applicable to a so-called one-piece golf ball composed of a crosslinked rubber layer, a so-called two-piece golf ball composed of a core made of a crosslinked rubber layer and a cover covering the core, and a so-called multi-piece golf ball composed of three or more layers. That is, the simulation method of the present invention is applicable to golf balls composed of the viscoelastic material and having any constructions.

The viscoelastic material includes materials having viscosity. For example, thermoplastic resin, thermosetting resin, elastomers, and rubber can be used as the viscoelastic material. It is possible to use these viscoelastic materials singly or a mixture thereof. It is possible to add additives such as a colorant, a deterioration prevention agent, and a crosslinking agent to these viscoelastic materials and the mixture thereof as necessary. The simulation method is applicable to all materials so long as the strain, the strain speed, and the stress thereof can be measured in a condition where a product made of them is actually used.

As the viscoelastic material, it is possible to use synthetic resin such as ionomer which is used as a material for a golf ball, polybutadiene (butadiene rubber), natural rubber, polyisoprene, styrene-butadiene copolymer, ethylene-propylene-diene copolymer (EPDM), and urethane rubber.

As products composed of the viscoelastic material, in addition to the golf ball, a rubber roller and a rubber belt for a printing apparatus, a tire, and sports goods, for example, goods for tennis, golf, and the like are known. It is necessary that the viscoelastic material is used in at least one portion of a product. For example, the viscoelastic material may be used in combination with other materials such as a metal material to form a composite molded product. The simulation method is capable of estimating the performance of a portion, of the product, constructed of the viscoelastic material. The simulation method is preferably applicable to a product that deforms at a high speed and in a large amount when it is subjected to an impact load. The simulation method is capable of estimating the performance of the product and its dynamic behavior with high accuracy.

BRIEF DESCRIPTION OF THE DRAWINGS

FIG. 10 shows a situation of a collision between a hollow rod model made of aluminum and a golf ball model.

BEST MODE FOR CARRYING OUT THE INVENTION

The modes of the present invention will be described below with reference to the drawings.

The mode of the first invention is described below. In the simulation method according to the first mode of the present invention, as a viscoelastic material showing nonlinearity, a material containing butadiene rubber as its main component which is a composing material of a golf ball is used. By using the above-described material containing the butadiene rubber as its main component as a specimen and a split Hopkinson rod testing machine improved in its construction, a strain, a strain speed, and a stress generated in the material containing the butadiene rubber as its main component are measured momently in a measuring condition in which the material deforms greatly at a high speed, assuming that a golf ball made of the material is actually used. The measuring method to be carried out by using the split Hopkinson rod testing machine will be described later.

Figure 1:
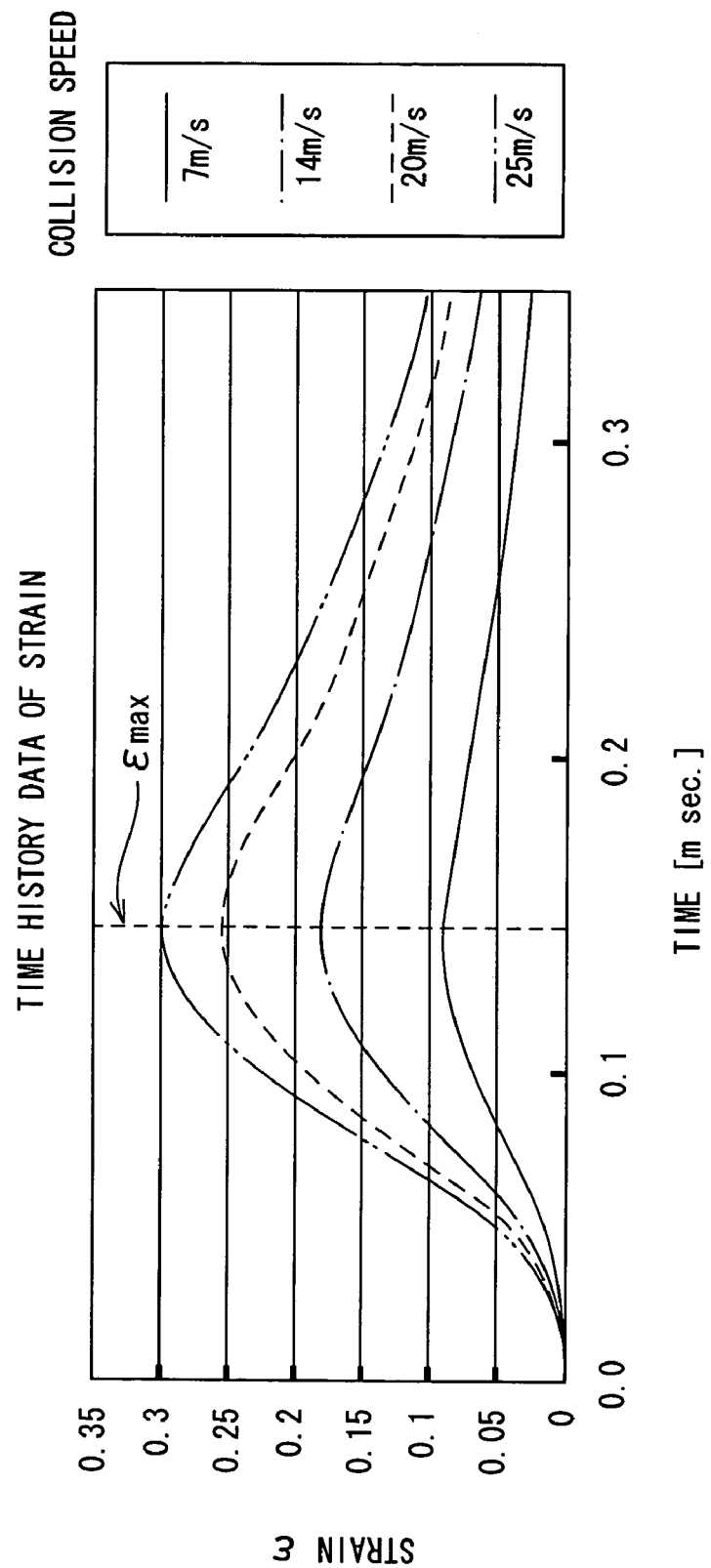
FIG. 1 shows time history data of a strain $\epsilon$ in a first mode of the present invention of the present invention.
Figure 2:
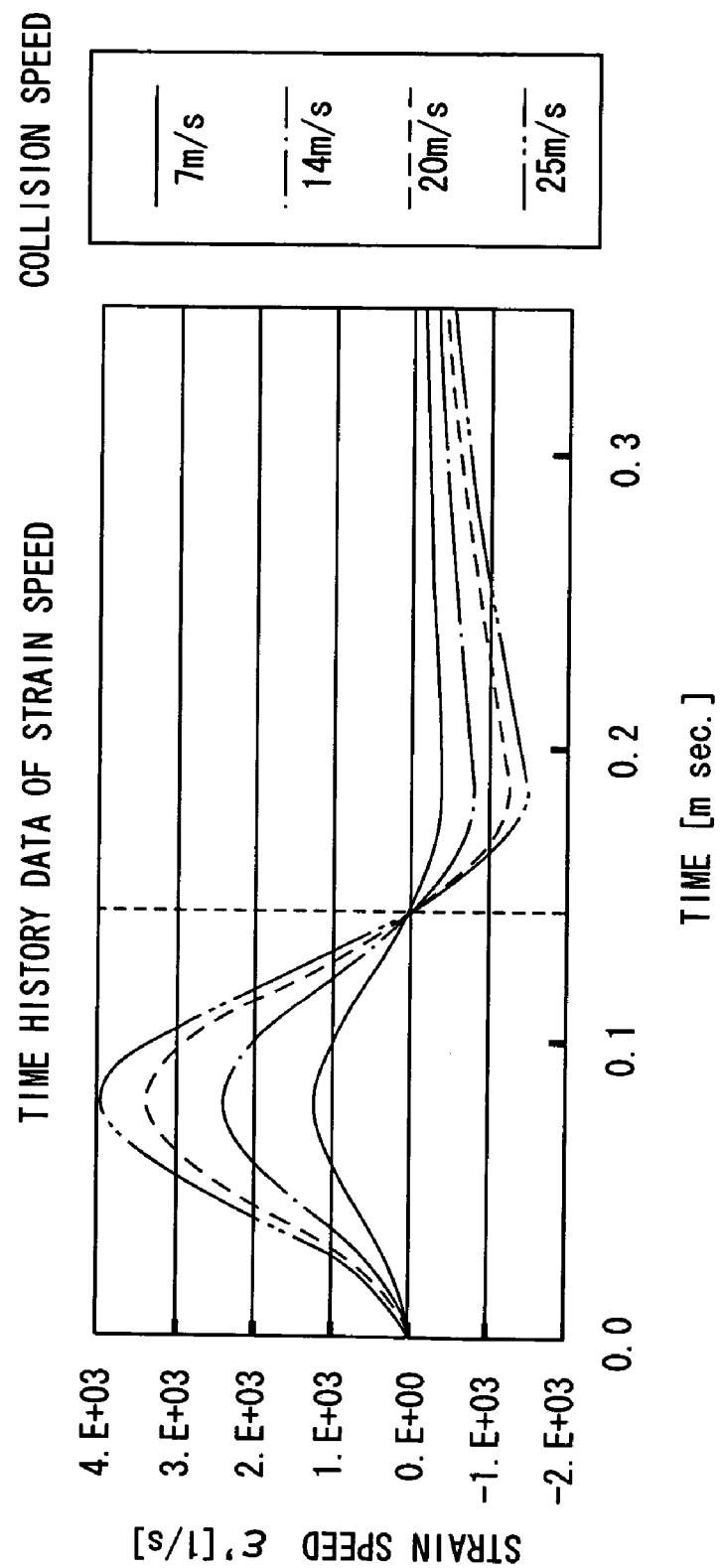
FIG. 2 shows time history data of a strain speed $\epsilon'$ in the first mode of the present invention.
Figure 3:
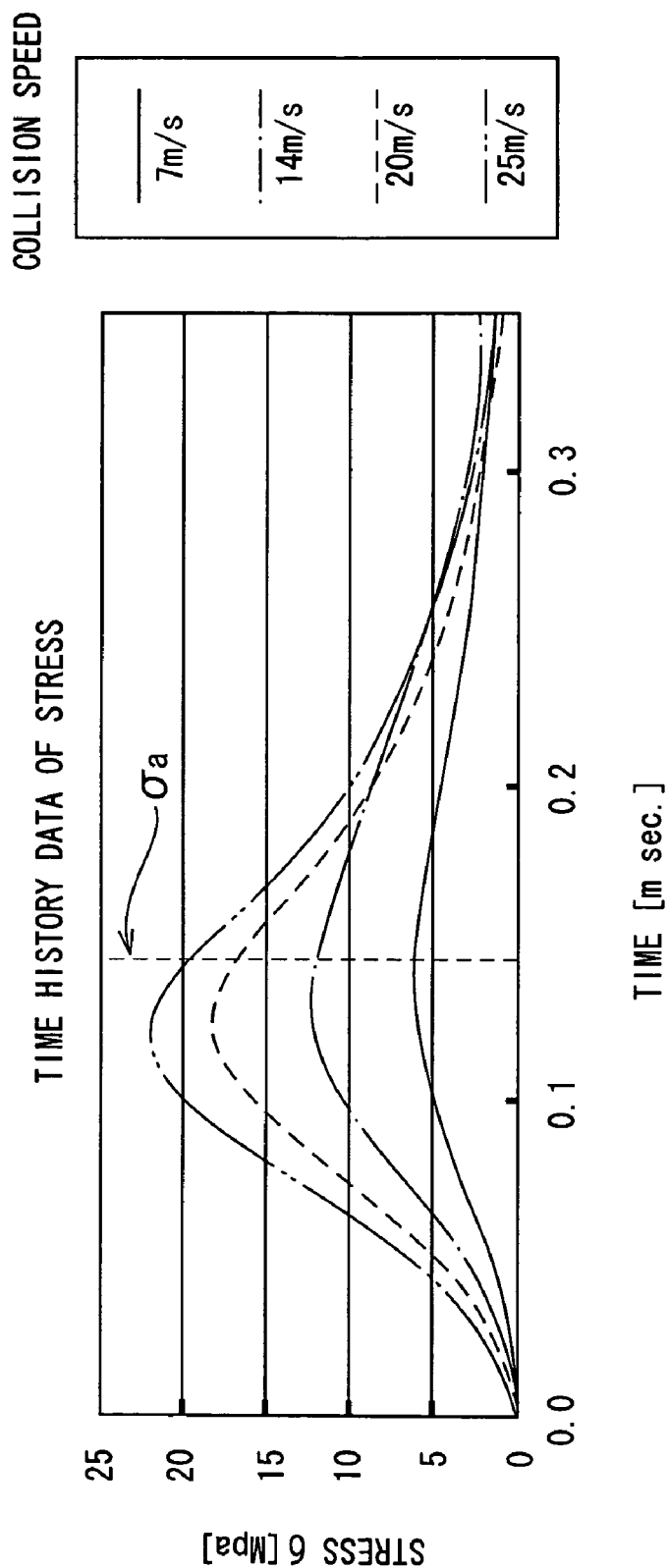
FIG. 3 shows time history data of a stress $\sigma$ in the first mode of the present invention.

The split Hopkinson rod testing machine is capable of measuring property of the material in various regions of the strain and the strain speed by altering the collision speed of a hitting rod. In the first mode of the present invention, four different patterns of the collision speed (7 m/s, 14 m/s, 20 m/s, and 25 m/s) are adopted, and the property of the material are measured in four different measuring conditions to obtain time history data of the strain, the strain speed, and the stress in each of the four collision patterns. FIGS. 1, 2, and 3 show the time history data of the strain $\epsilon$, the strain speed $\epsilon'$, and the stress $\sigma$ respectively.

As shown in FIG. 1, after the hitting rod collides with the material by using the split Hopkinson rod testing machine, the material containing butadiene rubber as its main component generates a strain. The value of the strain increases in a certain period of time and then decreases gently. As shown in FIG. 2, the strain speed shows positive values until the strain attains a maximum value, and then shows negative values. As shown in FIG. 3, the value of the stress changes with the elapse of time.

Figure 4:
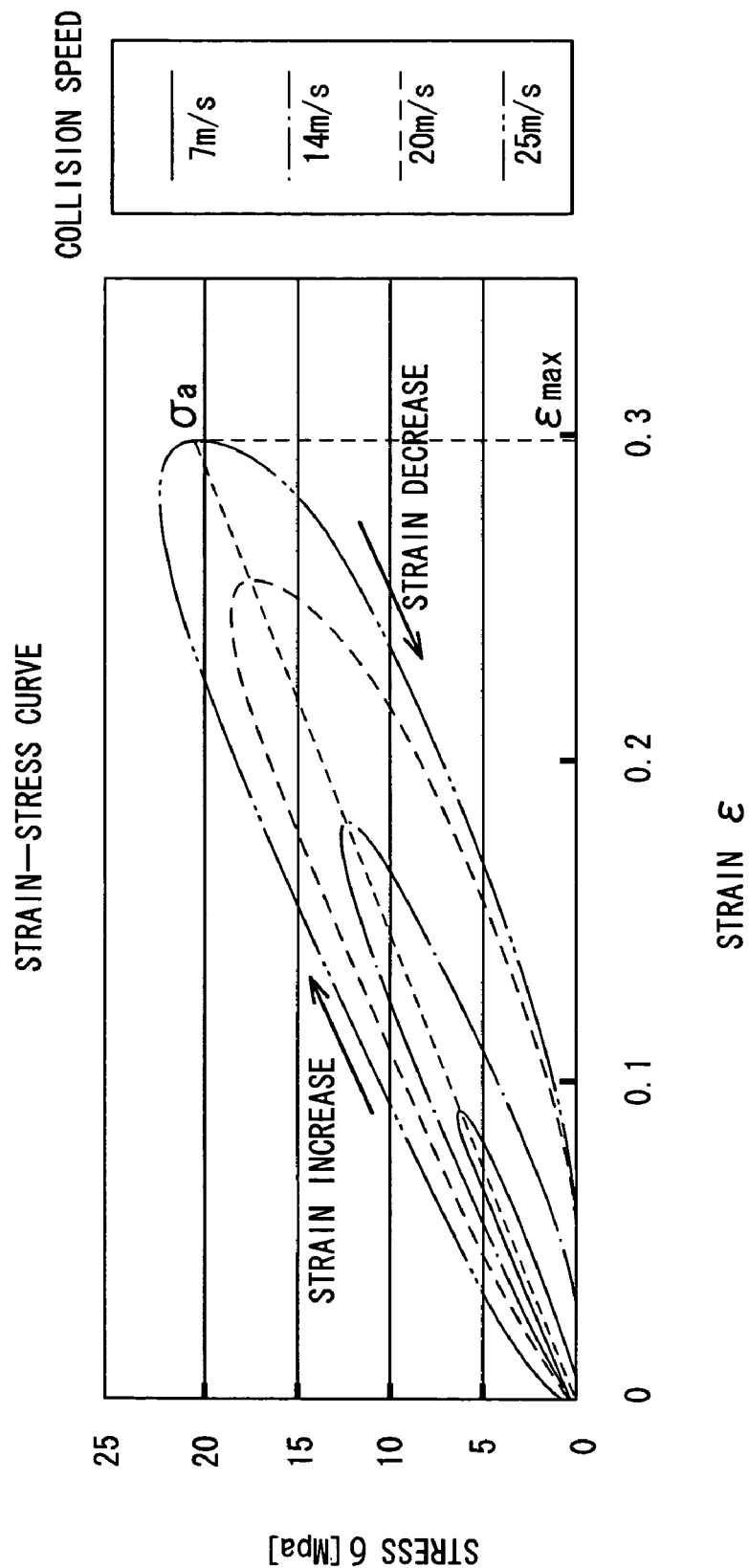
FIG. 4 shows a strain-stress curve and a method of computing a modulus of longitudinal elasticity in the first mode of the present invention.

FIG. 4 shows a strain-stress curve drawn on the basis of the time history data of the strain and the stress. In the graph of FIG. 4, the modulus of longitudinal elasticity E of the specimen in each of the collision patterns is computed by using the maximum strain value $\epsilon_{max}$ and the stress value $\sigma_a$ corresponding to the maximum strain value $\epsilon_{max}$ and by using an equation (4) shown below.

(Equation 4)

$$E = \sigma_a / \epsilon_{max} \quad (4)$$

In the case of the material containing the butadiene rubber as its main component used in the first mode of the present invention, even when the collision speed of the hitting rod of the split Hopkinson rod testing machine is altered, the specimen has the same modulus of longitudinal elasticity in each collision pattern.

Figure 5:
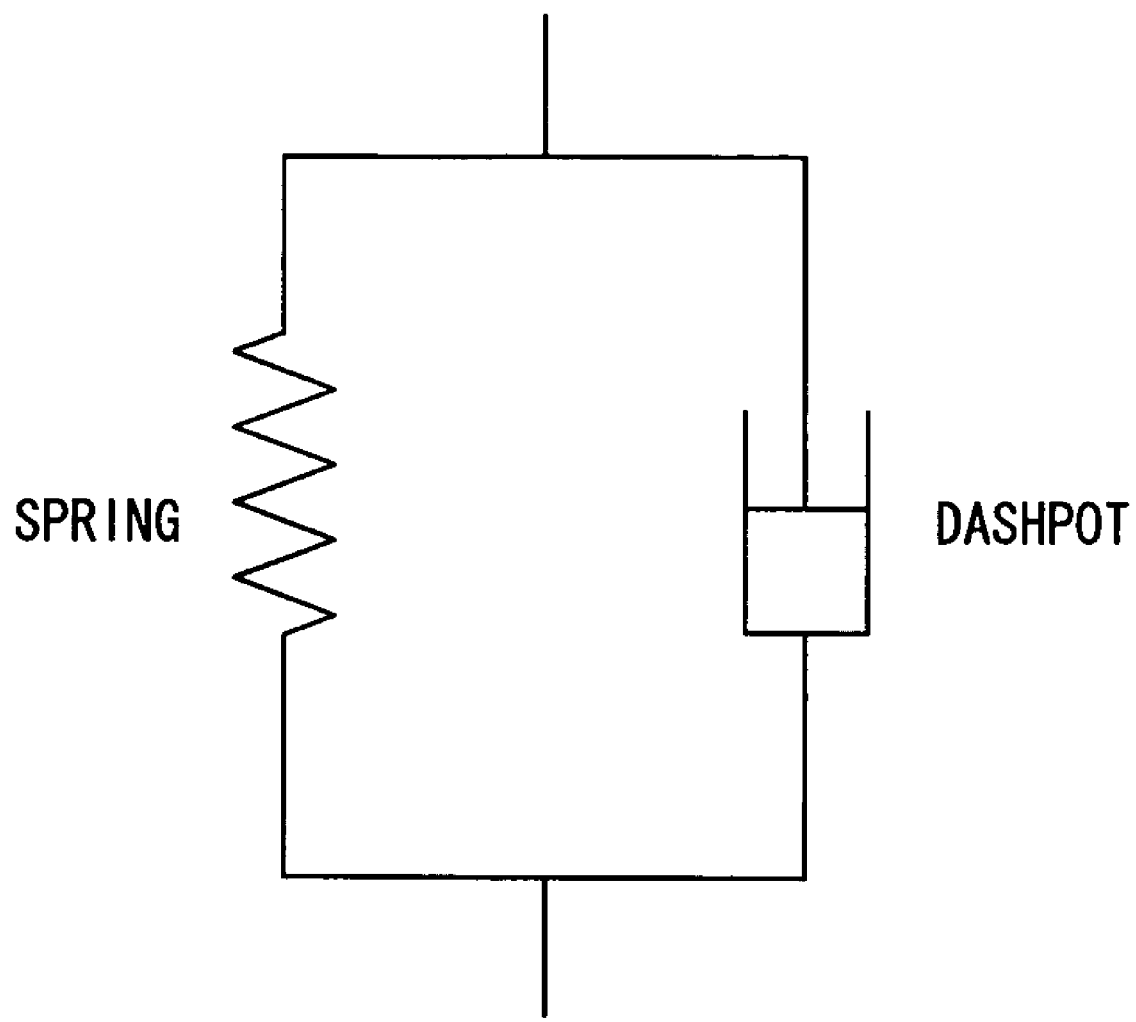
FIG. 5 shows a two-component Voight model used as a viscoelastic model of the first mode of the present invention.

To conduct a simulation in consideration of the viscosity of a product composed of the viscoelastic material, a viscoelastic model in which the viscosity of the viscoelastic material is considered is set. More specifically, in the first mode, a fundamental two-component Voight model shown in FIG. 5 is used as the viscoelastic model consisting of a spring and a dashpot. That is, the viscoelastic material model is used in such a way that the viscous drag η of the dashpot and the rigidity of the spring (modulus of longitudinal elasticity E or shear coefficient) are variable.

As shown in FIG. 5, in the fundamental two-component Voight model used as the viscoelastic model, assuming that a stress generated in the spring is $\sigma_1$ and a stress generated in the dashpot is a $\sigma_2$, a stress $\sigma$ generated by the entire viscoelastic model can be expressed by an equation (5) shown below:

(Equation 5)

$$\sigma = \sigma_1 + \sigma_2 \quad (5)$$
$$= E\varepsilon + \eta\varepsilon'$$

Therefore from the equation (5), the viscous drag η of the viscoelastic model can be expressed by an equation (6) shown below:

(Equation 6)

$$\eta = (\sigma - E\epsilon)/\epsilon' \quad (6)$$

Figure 6:
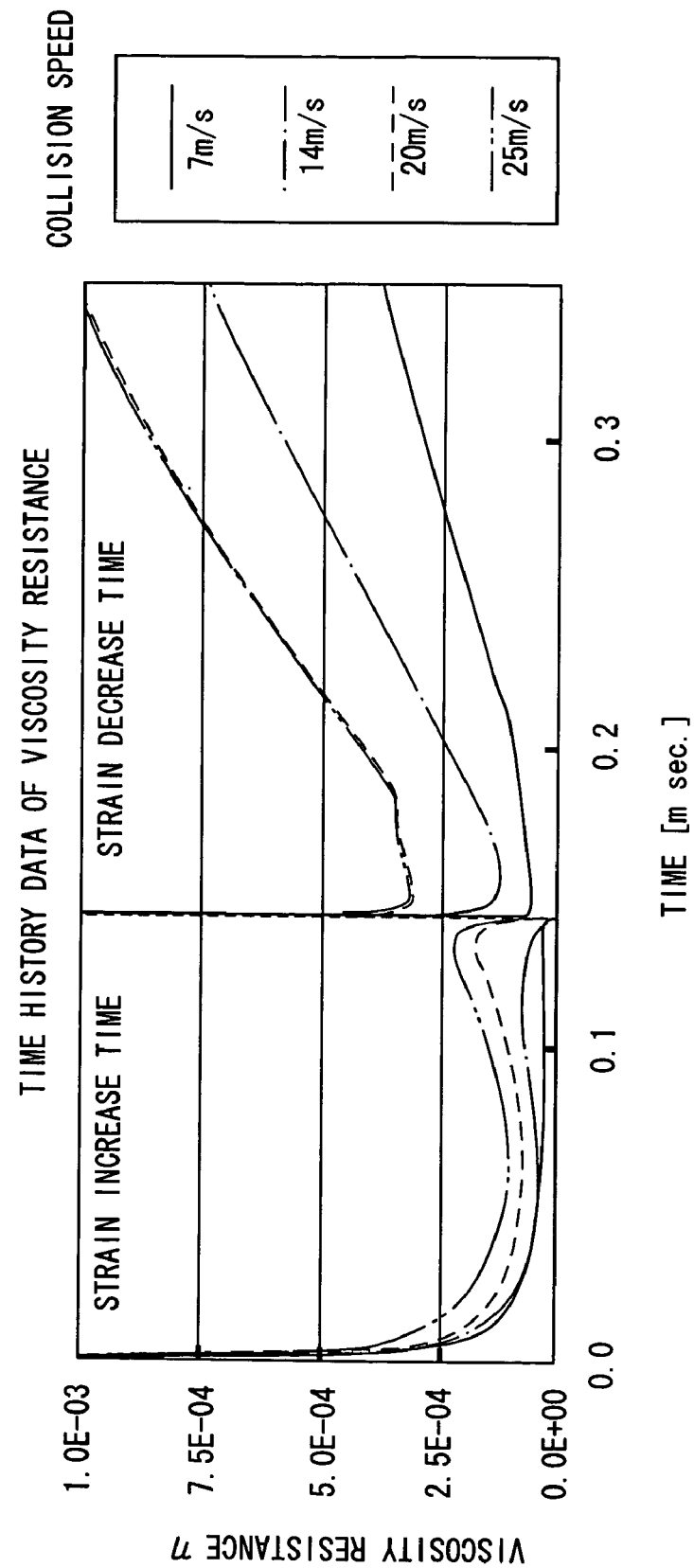
FIG. 6 shows time history data of a viscous drag in the first mode of the present invention.

Therefore from the time history data of the strain $\epsilon$, the strain speed $\epsilon'$, and the stress σ shown in FIGS. 1, 2, and 3 respectively and the equation (3), the viscous drag η of the viscoelastic model corresponding to the strain $\epsilon$ as well as the strain speed $\epsilon'$ can be computed momently. As described above, the value of each of the strain, the strain speed, and the stress changes with the elapse of time. The state of the strain generated in the viscoelastic material can be divided into a "strain increase state" in which the applied strain increases in a compression direction thereof and a "strain restoration state" in which a compression amount thereof decreases gradually. Therefore the viscous drag is computed separately in each of the case in which strain generated in the viscoelastic material is in the strain increase state and the case in which strain generated therein is in the strain decrease state (or strain restoration state) to obtain the time history data of the viscous drag at each of the collision speeds, as shown in FIG. 6.

Based on the strain and the stress obtained by the measurement conducted under the condition of the high speed and the great deformation, the modulus of longitudinal elasticity E of the viscoelastic material is determined in consideration of the viscosity thereof. Then by using the equation (6) derived from the viscoelastic model in which the viscosity is taken into consideration, the viscous drag η is computed separately in the strain increase state and the strain decrease state (or strain restoration state). The obtained viscous drag η is applied to the simulation.

Figure 7:
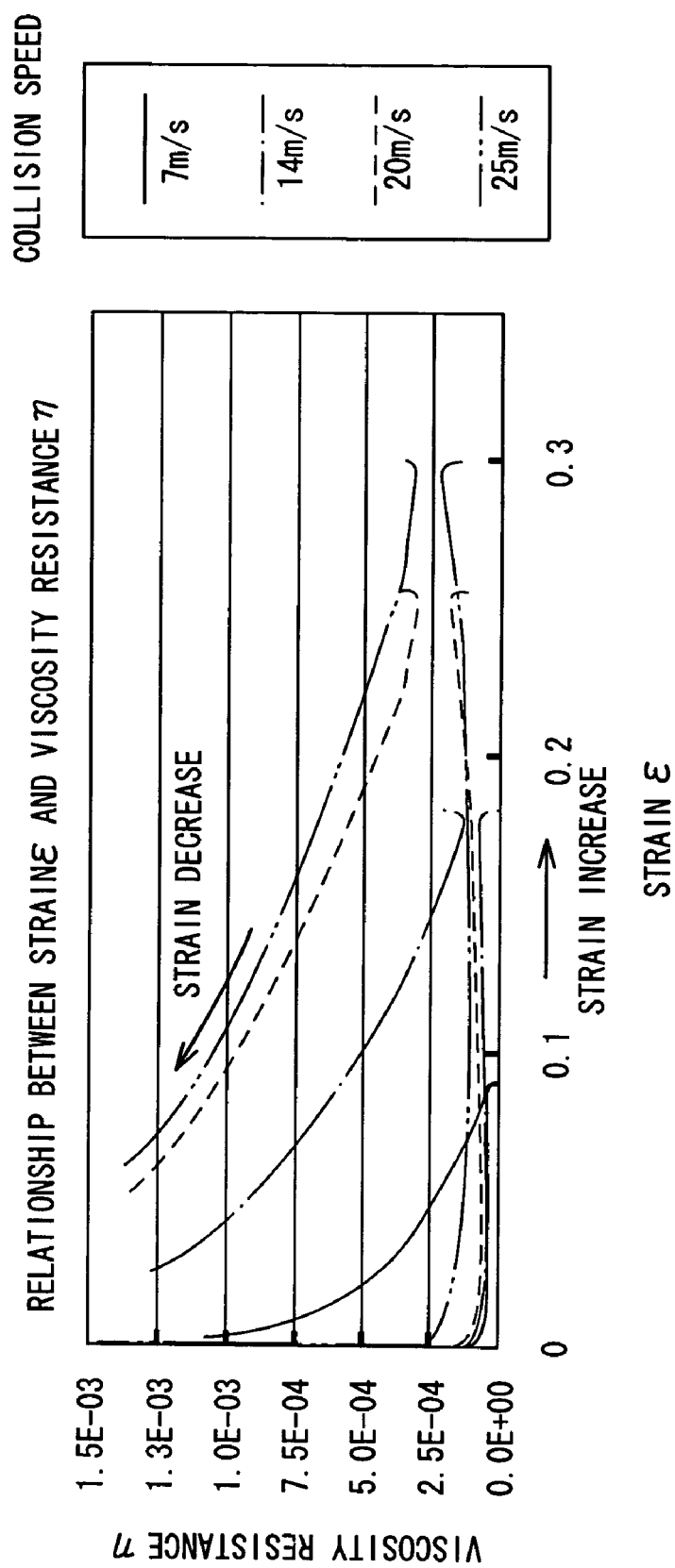
FIG. 7 shows the relationship between the strain and the viscous drag in the first mode of the present invention.
Figure 8:
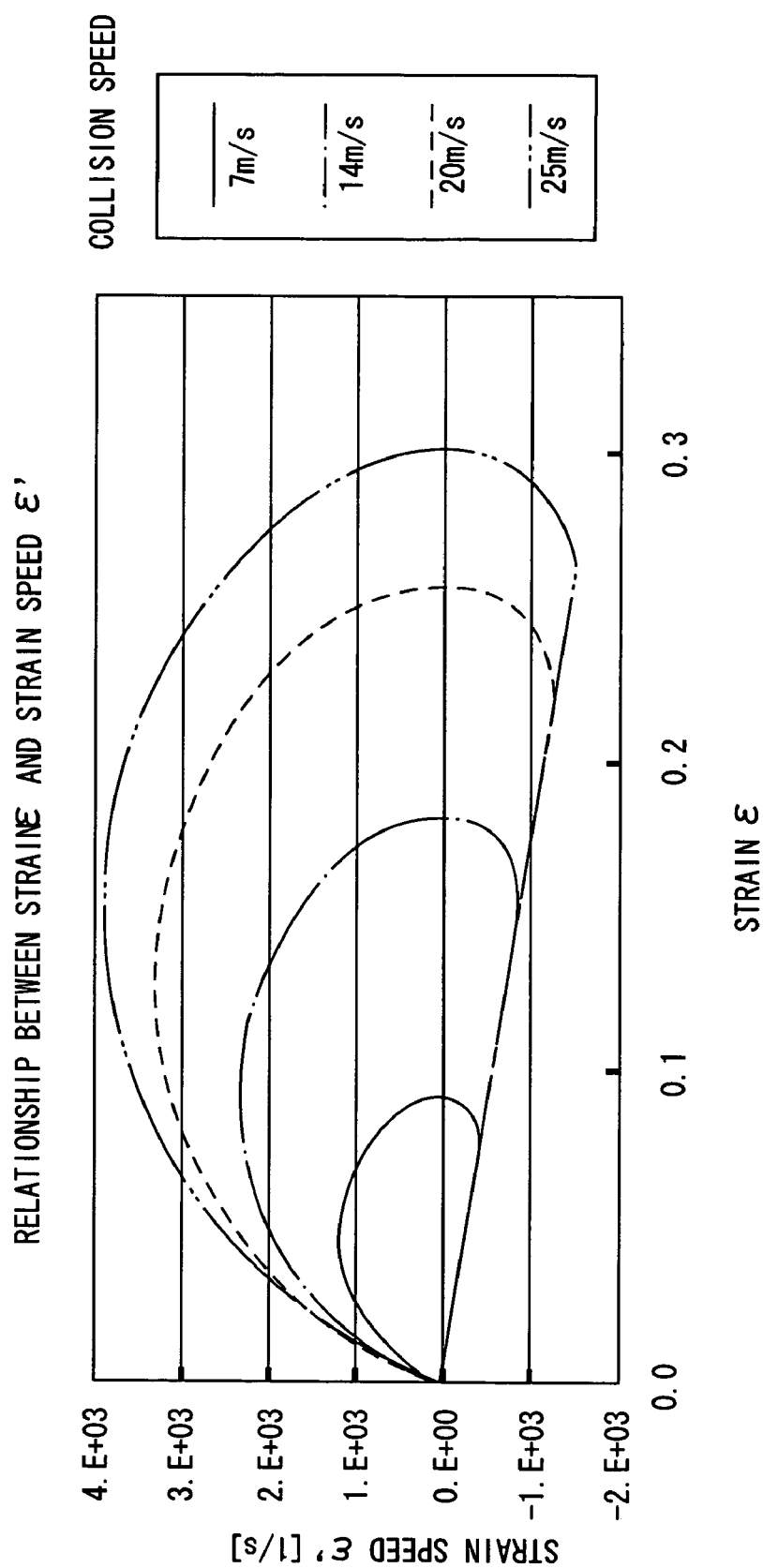
FIG. 8 shows the relationship between the strain and the strain speed in the first mode of the present invention.

FIG. 7 shows the relationship between the strain and the viscous drag obtained from the time history data of the strain and the viscous drag. As shown in FIG. 7, at an equal value of the strain, the value of the viscous drag in the strain increase state is different from the value thereof in the strain decrease state (or strain restoration state). FIG. 8 shows the relationship between the strain and the strain speed obtained from the time history data of the strain and the strain speed. As shown in FIG. 8, the viscous drag changes in dependence on the variation of the strain and the strain speed, and the value thereof in the strain increase state is different from the value thereof in the strain decrease state (or strain restoration state). Thus the viscous drag can be determined in dependence on the strain and the strain speed and is computed separately in each of the strain increase state and the strain decrease state (or strain restoration state). That is, the viscous drag is the function of the strain and the strain speed. In FIG. 8, the data at the four different collision speeds look as though they overlap each other linearly in the negative region of the strain speed. However the actual values of the strain and those of the strain speed at the four different collision speeds are different from each other respectively.

The simulation is conducted by writing the relationship between the strain and the viscous drag shown in FIG. 7 and the relationship between the strain and the strain speed shown in FIG. 8 as input data in each collision pattern, as will be described later and by making an analysis based on the finite element method in consideration of a change of the viscous drag that occurs in dependence on a variation of the strain and the strain speed and in consideration of a change of the viscous drag that occurs in dependence on the strain increase state and the strain decrease state (or strain restoration state).

Figure 9:
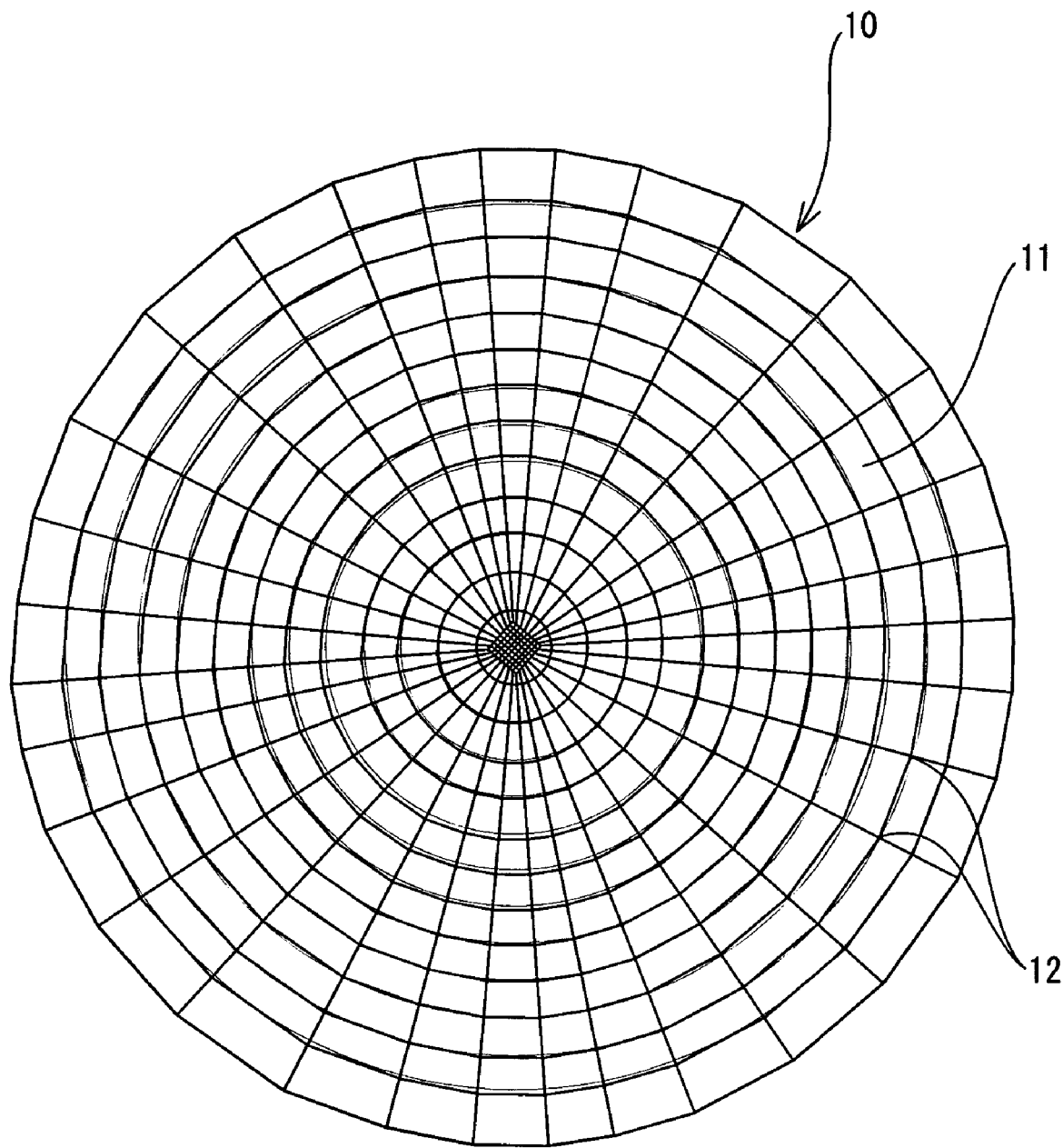
FIG. 9 shows a division situation of a golf ball model by means of meshes.

In the first mode of the present invention, a golf ball model is set as a product model composed of the viscoelastic material to conduct the simulation, assuming that a golf club head collides with the golf ball. As shown in FIG. 9, a golf ball model 10 is assumed to be a one-piece ball containing butadiene rubber as its main component and has a diameter of 42.8 mm.

In executing the analysis based on the finite element method, an initial condition is set on the product model. That is, the initial condition of the size, configuration, construction, and the like of the golf ball model 10 is set, and the golf ball model 10 is divided into a large number of mesh elements 11 to obtain a large number of nodal points 12. The total number of the mesh elements of the golf ball model 10 is favorably 1000–100000 and more favorably 2500–20000. The upper limit value is set in view of the capability of a computer currently available. As the capability of the computer is improved, a time period required to execute the analysis based on the finite element method is reduced. Thus it is easy to imagine that the upper limit value changes.

Based on the above-described set condition, the data of the golf ball model 10 and the relationship among the strain, the strain speed, and the viscous drag are written as the input data in computations to be performed in the simulation. When computations are performed, an appropriate viscous drag is computed for each element momently, and computations of the equations are performed by using the viscous drags. In the simulation, two-dimensional data of the relationship between the strain and the strain speed and the relationship between the strain and the viscous drag in each of the strain increase state and the strain decrease state (or strain restoration state) are inputted to perform computations. From time series data of the strain and the strain speed in each of the four patterns different from one another in measuring conditions, the correspondence relationship between the strain and the strain speed in each pattern is recorded, and the strain, the strain speed, and the viscous drag corresponding to the strain as well as the strain speed are written as the input data. In the case of a strain and a strain speed not the same as the data of the strains and the strain speeds measured under the four different measuring conditions, a primary interpolation is performed by using a binary value of the viscous drag measured in a condition of a proximate strain and a proximate strain speed.

More specifically, when attention is paid to one element, information of a strain and a strain speed generated in the element is obtained. Thereafter based on the relationship between the strain and the strain speed obtained from measurement in each collision case (measurement case) and with reference to the value of the strain speed when the strain having an equal value is generated in each collision case, two collision cases each having the value of the strain speed close to the value of the strain speed of the attention-given element are searched. By using the value of each of the strain speed and the viscous drag when the values of the strains corresponding to the strain speeds of the two collision cases are equal to each other, the interpolation is performed to compute an appropriate value of the viscous drag corresponding to the strain and the strain speed generated in the attention-given element. That is, in the first mode of the present invention, a simple primary interpolation is performed. By determining the viscous drag in dependence on the strain and the strain speed generated in each element, the property of the material in an appropriate condition of the strain and the strain speed is expressed for each element.

The strain and the strain speed of an entire coordinate system generated in each element are resolved into deviation components and volume components. Then the strain and the strain speed of the deviation components are converted from the entire coordinate system into a main strain coordinate system and a main strain speed coordinate system respectively. Thereafter by using a converted deviation main strain and a converted deviation main strain speed, a viscous drag is determined for each coordinate axis from FIGS. 7 and 8, as described above. By using the equations 1, 2, and 3, a stress and a strain of the deviation components in which the viscoelasticity is taken into consideration are computed from on the viscous drag. Thereafter the stress of the deviation components and the strain thereof are re-converted into the entire coordinate system. Based on the stress of the volume components and the strain thereof and the stress of the deviation components and the strain thereof, the stress and strain of each element are computed.

More specifically, six strain components generated in each element are converted into the main strain coordinate system to determine three strain components in a main axis direction. The strain and the strain speed of the entire coordinate system generated in each element are resolved into the volume components and the deviation components in which the viscoelasticity is taken into consideration. Six deviation components of the resolved strain and strain speed are converted into the main strain coordinate system and main strain speed coordinate system from the entire coordinate system. Thereafter by using three components of the deviation main strain in the main strain coordinate system and three components of the deviation main strain speed in the main strain speed coordinate system, the viscous drag is determined for each axis of the main strain coordinate system and the main strain speed coordinate system.

Figure 10A:
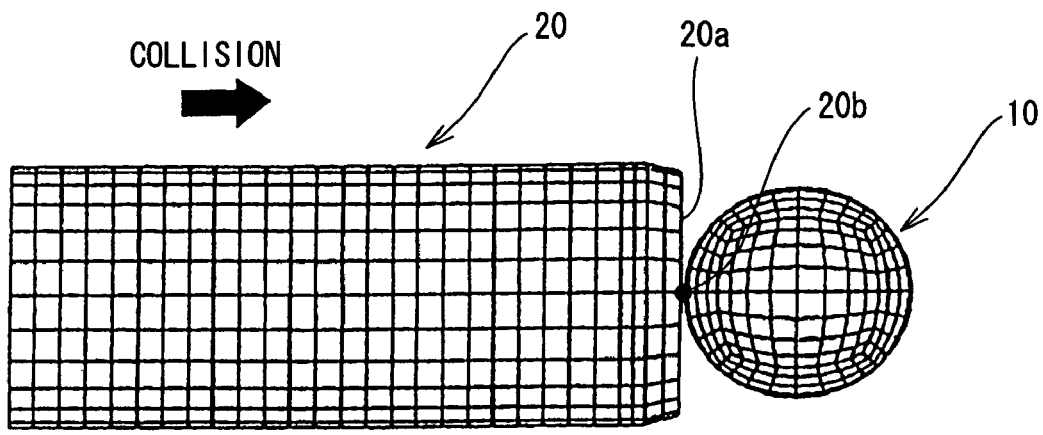
FIG. 10A shows a situation before the collision.
Figure 10B:
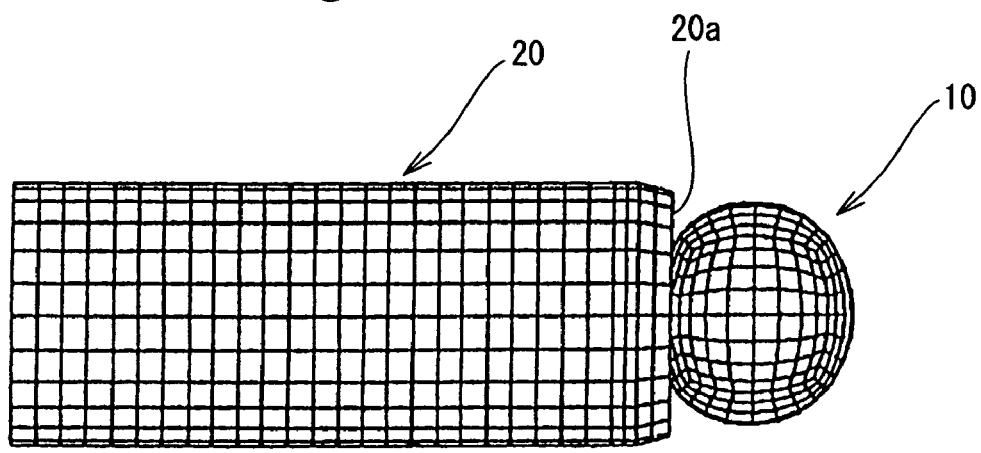
FIG. 10B shows a situation at the time of the collision.
Figure 10C:
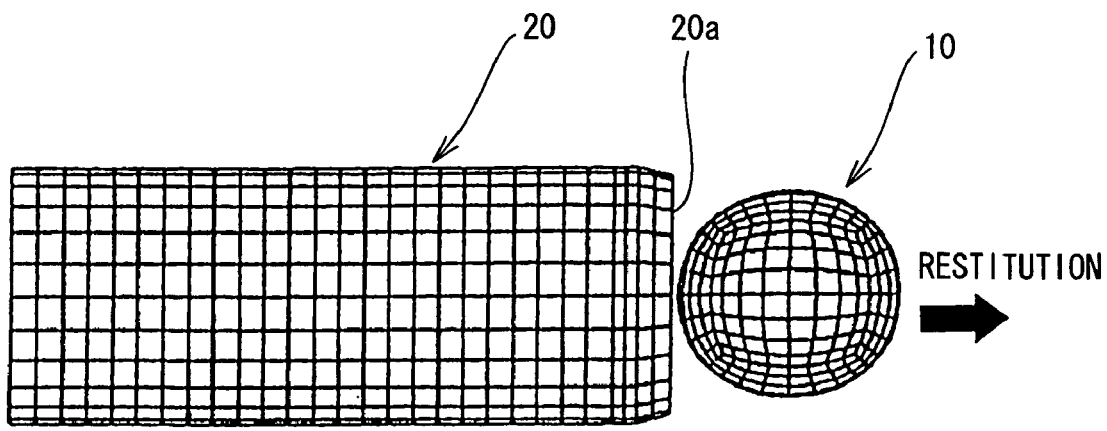
FIG. 10C shows a situation after the collision.

In the first mode of the present invention, as shown in FIGS. 10A, 10B, and 10C, the simulation is conducted by analyzing the property of the material for the golf ball model 10 by using the finite element method, when an aluminum cylindrical hollow rod model 20, having a weight of 200 g (equal to weight of golf club head), serving as a hitting object collides with the golf ball model 10 at a speed of 45 m/s. Thereby computations is performed to find the amount of the strain generated in each element 11 of the golf ball model 10 in a predetermined period of time from the time of collision between the golf ball model 10 and the cylindrical hollow rod model 20.

A mass is distributed to each of nodal points constituting one element. Each nodal point is replaced with a material point. The speed of each nodal point is regarded as the speed of the material point. Thus the speeds of total the nodal points are divided by the number of the nodal points to obtain the speed of the ball. That is, the speed $V_{bi}$ (i=x, y, z) of the impacted ball is computed as follows by an equation (7) shown below. The entire momentum of the ball is regarded as the sum of the momentums of all the material points. Thus a value obtained by dividing all the momentums by the total weight is defined as the launching speed $V_{bi}$ of the ball.

(Equation 7)

$$Vbi = \frac{\sum_{n=1}^{N} Mn\,Vni}{M} \quad (7)$$

Where N is the number of the nodal points, M is the total mass, Vni is an n-th translation speed, and Mn is a value obtained by dividing the mass of an element including the nodal points by the number of the nodal points included in the element.

A circular surface 20a of the cylindrical hollow rod model 20 made of aluminum is set as a collision surface. The collision surface is flat. The cylindrical hollow rod model 20 collides head-on with the golf ball model 10. A central point 20b of the circular surface 20a of the cylindrical hollow rod model 20 collides first with the golf ball model 10.

By using the above-described method, the speed of the cylindrical hollow rod model 20 and that of the golf ball 10 before and after the collision therebetween are computed. The restitution coefficient of the golf ball 10 is computed from the speed and weight of each of the cylindrical hollow rod model 20 and the golf ball 10 to estimate the performance of the golf ball model 10.

As described above, the strain and the strain speed are resolved into the deviation components and the volume components. By using the main strain and main strain speed of the deviation components resolved into the main strain coordinate system and the main strain speed coordinate system respectively, the viscous drag is determined for the coordinate axis of each of the main strain coordinate system and the main strain speed coordinate system in such a way that for each element, the viscous drag is variable for three components in the direction of each axis. Therefore it is possible to make a correct analysis of a three-dimensional direction in consideration of the viscoelasticity of the viscoelastic material and improve the simulation precision.

The simulation is conducted by determining the viscous drag computed separately in the strain increase state and the strain decrease state (or strain restoration state) as the function of the strain and the strain speed, inputting the relationship among the strain, the strain speed, and the viscous drag to the golf ball model, and executing an analysis based on the finite element method. Therefore it is possible to compute the viscous drag corresponding to the strain and the strain speed of each element momently from the strain and the strain speed in consideration of the difference in the value of the viscous drag between the strain increase state and the strain decrease state (or strain restoration state) and estimate with very high precision the characteristic of the viscoelastic material having a high nonlinearity in the condition of a high speed and a great deformation.

Therefore in a condition equivalent to a condition in which the golf ball model is hit with an actual golf club head, it is possible to correctly apprehend the performance of the golf ball model such as the restitution coefficient and dynamic behavior of the golf ball model composed of the viscoelastic material without making the golf ball as an experiment.

Figure 11:
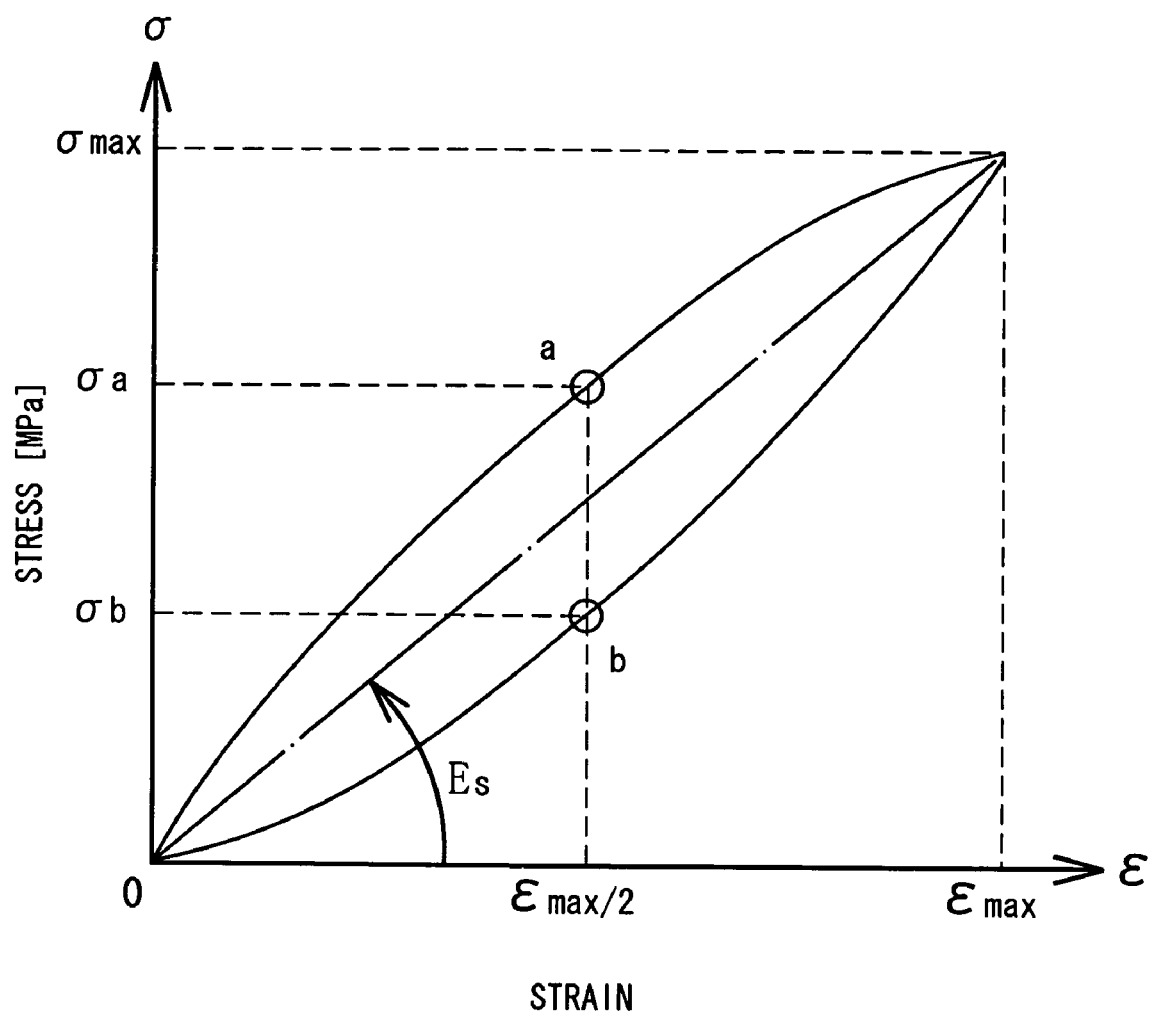
FIG. 11 shows a method of computing a loss coefficient.

From a stress-strain curve of FIG. 11, a phase angle δ is computed by using an equation (8) shown below. A loss coefficient (tan δ) can be computed from the phase angle δ.

(Equation 8)

$$\delta = \sin^{-1}((\sigma_a - \sigma_b)/\sigma_{max}) \quad (8)$$

The mode of the second invention is described below. In the simulation method according to the second mode of the present invention, as a viscoelastic material showing nonlinearity, a material containing urethane rubber as its main component which is a composing material of a golf ball is used. By using the above-described material containing the urethane rubber as its main component as a specimen and a split Hopkinson rod testing machine improved in its construction, a strain, a strain speed, and a stress generated in the material containing the urethane rubber as its main component are measured momently in a measuring condition of a high speed a great deformation, assuming that the golf ball is actually used.

Figure 12:
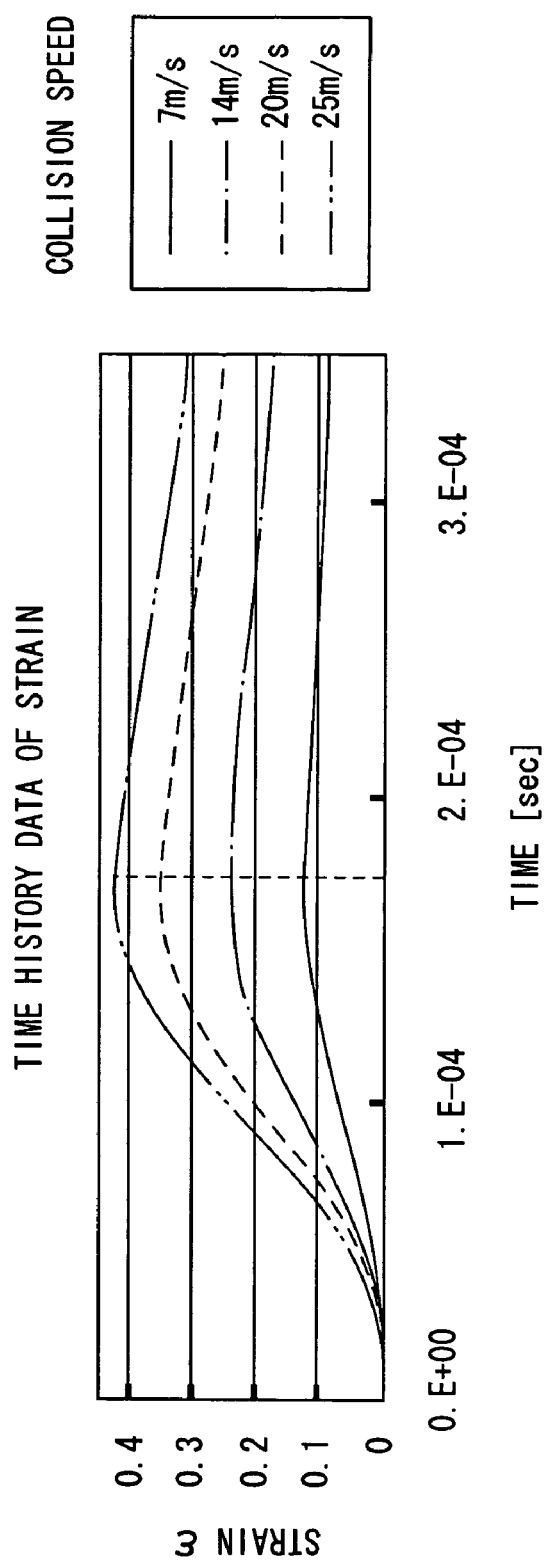
FIG. 12 shows time history data of a strain $\epsilon$ in a second mode of the present invention.
Figure 13:
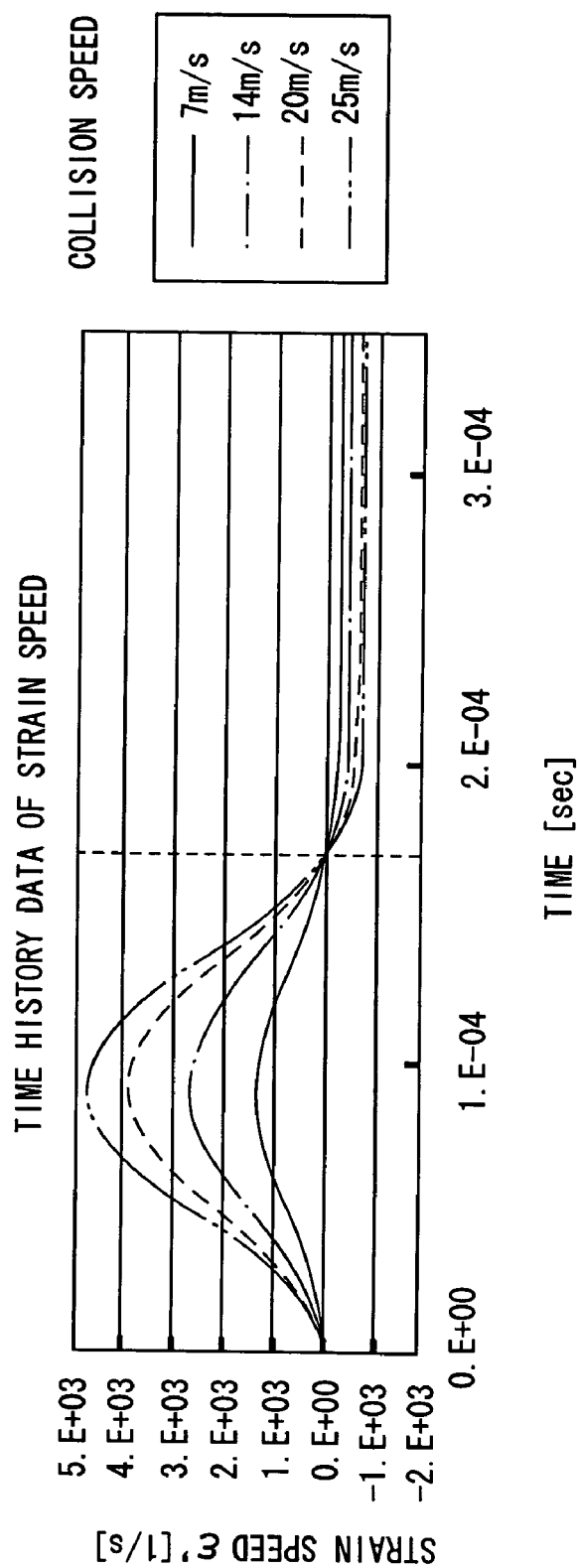
FIG. 13 shows time history data of a strain speed $\epsilon'$ in the second mode of the present invention.
Figure 14:
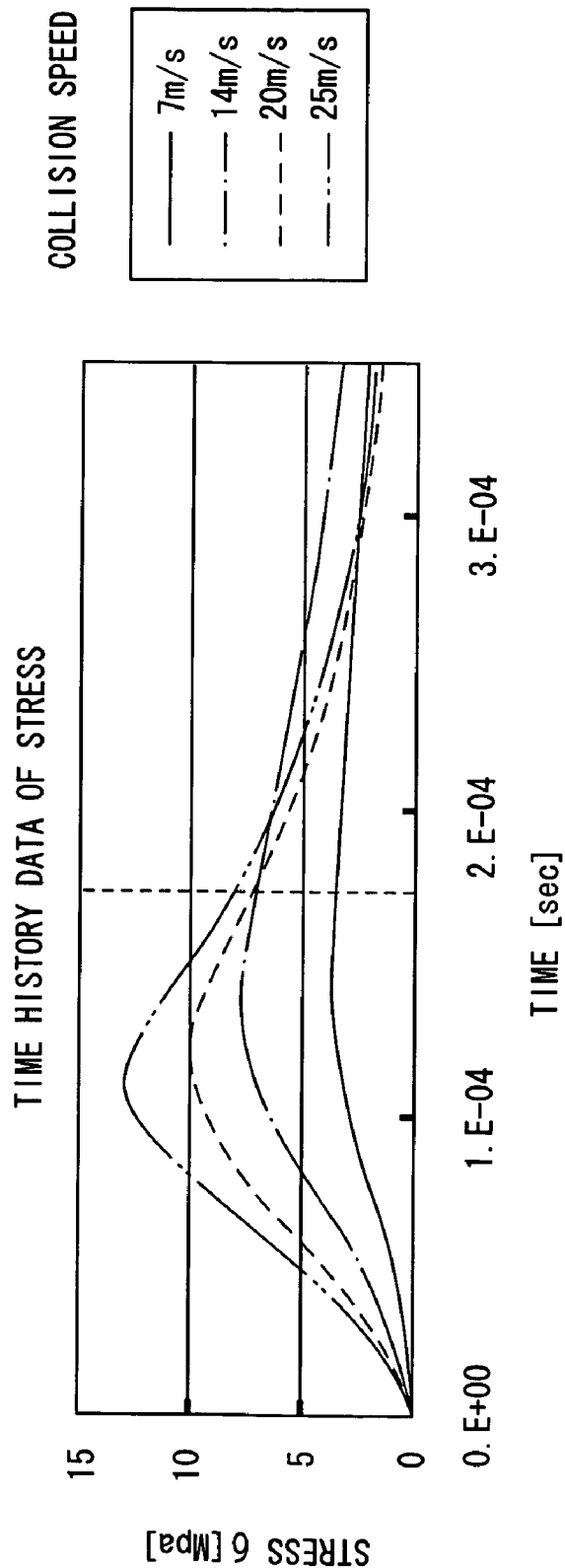
FIG. 14 shows time history data of a stress $\sigma$ in the second mode of the present invention.

In the second mode of the present invention, four different patterns of the collision speed (7 m/s, 14 m/s, 20 m/s, and 25 m/s) are adopted, and the property of the material is measured in four different measuring conditions to obtain time history data of the strain, the strain speed, and the stress in each of the four collision patterns. FIGS. 12, 13, and 14 show the time history data of the strain ε, the strain speed ε', and the stress σ in each of the four collision patterns respectively.

Figure 15:
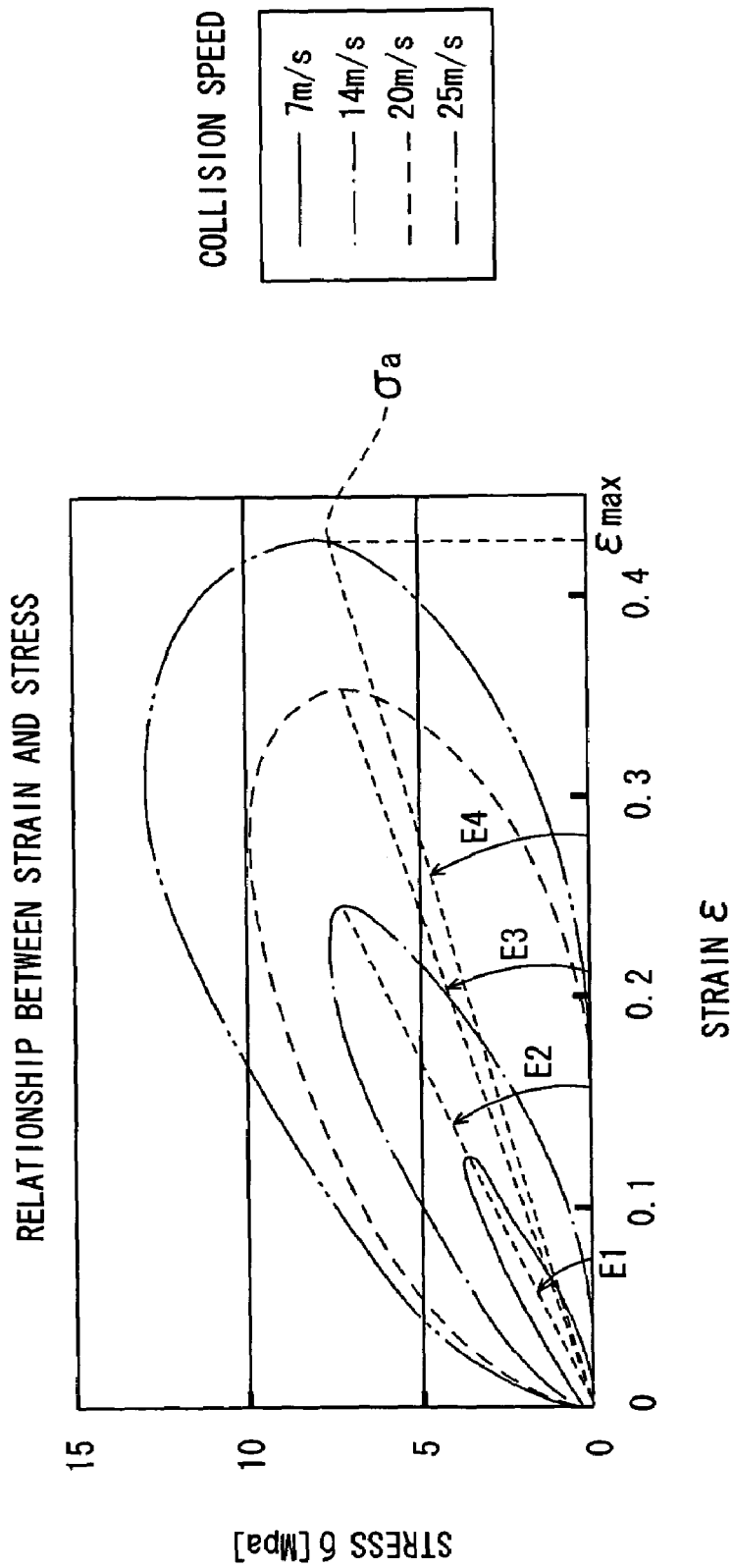
FIG. 15 shows a strain-stress curve and a method of computing a modulus of longitudinal elasticity in the second mode of the present invention.

FIG. 15 shows a strain-stress curve drawn on the basis of the time history data of the strain and that of the stress. In the strain-stress curves of FIG. 15, the maximum strain value $\epsilon_{max}$ and the stress value $\sigma_a$ corresponding to the maximum strain value $\epsilon_{max}$ are substituted into the above-described equation (4) to find the modulus of longitudinal elasticity E of the specimen in each collision pattern. In FIG. 15, the modulus of longitudinal elasticity E at each collision speed is denoted as E1, E2, E3, and E4. In the material containing the urethane rubber as its main component, the value of the modulus of longitudinal elasticity which is one of rigidities thereof has a change (E1: 9.442 Mpa, E2: 9.839 Mpa, E3: 6.876 Mpa, E4: 6.251 Mpa) in each collision pattern, namely, in deformation states of the material.

Similarly to the first mode of the present invention, a viscoelastic model consisting of a spring and a dashpot as shown in FIG. 5 is used to find the viscous drag η from the equations (5) and (6).

Figure 16:
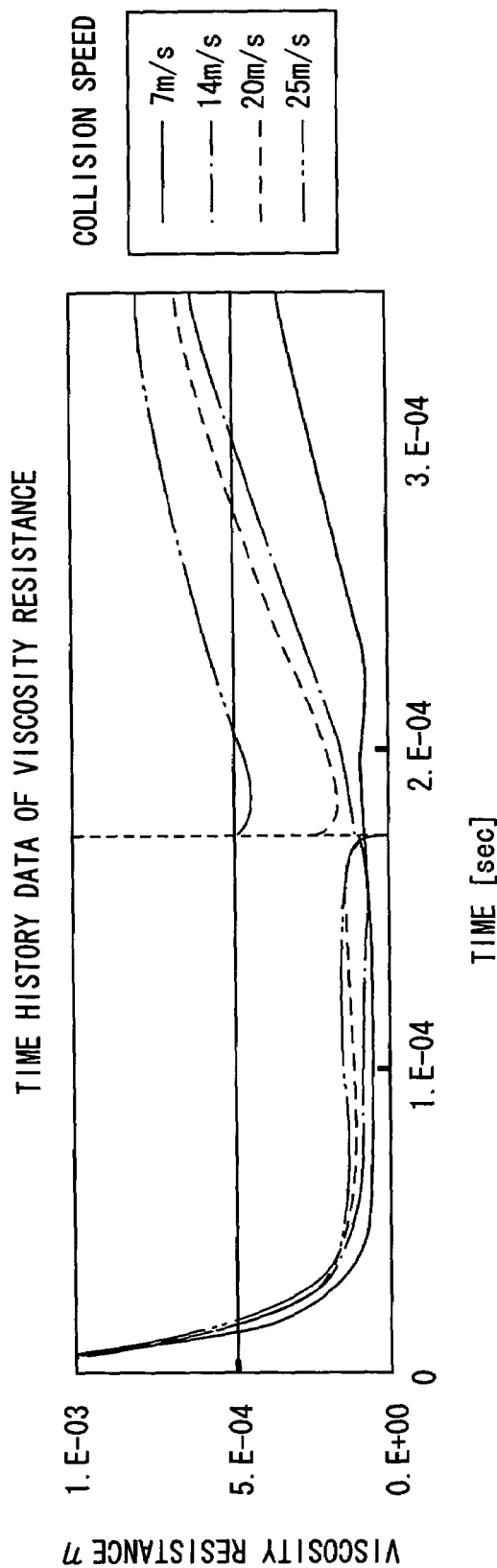
FIG. 16 shows time history data of a viscous drag in the second mode of the present invention.

Therefore from the time history data of the strain ε, the strain speed ε', and the stress σ shown in FIGS. 12, 13, and 14 respectively, the modulus of longitudinal elasticity E corresponding to the strain ε as well as the strain speed ε', and the equation (3), it is possible to find the viscous drag η momently in consideration of the modulus of longitudinal elasticity E which changes in correspondence to a variation of the strain ε and the strain speed ε', as shown in FIG. 16.

Based on the strain and the stress obtained by the measurement conducted under the condition of the high speed and the great deformation, the rigidity of the viscoelastic material such as the modulus of longitudinal elasticity and the modulus of transverse elasticity in each condition is determined. Thereafter the relationship among the strain, the strain speed, the rigidity such as the modulus of longitudinal elasticity is adjusted. Then the viscous drag η is computed from the equation (6) derived from the viscoelastic model in which the viscosity is taken into consideration. The obtained viscous drag η is applied to the simulation.

More specifically, the simulation is conducted by writing the relationship between the strain, the strain speed, and the modulus of longitudinal elasticity and the relationship between the strain, the strain speed, and the viscous drag as input data at each collision speed, as will be described later and by executing an analysis based on the finite element method with reference to a change of the rigidity such as the modulus of longitudinal elasticity and in consideration of a change of the viscous drag that occurs in dependence on a variation of the strain and the strain speed.

Similarly to the first mode of the present invention, in the second mode thereof, a one-piece ball containing the urethane rubber as its main component is set as the product model composed of the viscoelastic material to conduct the simulation, assuming that a golf club head (hitting object) collides with a golf ball.

Figure 17:
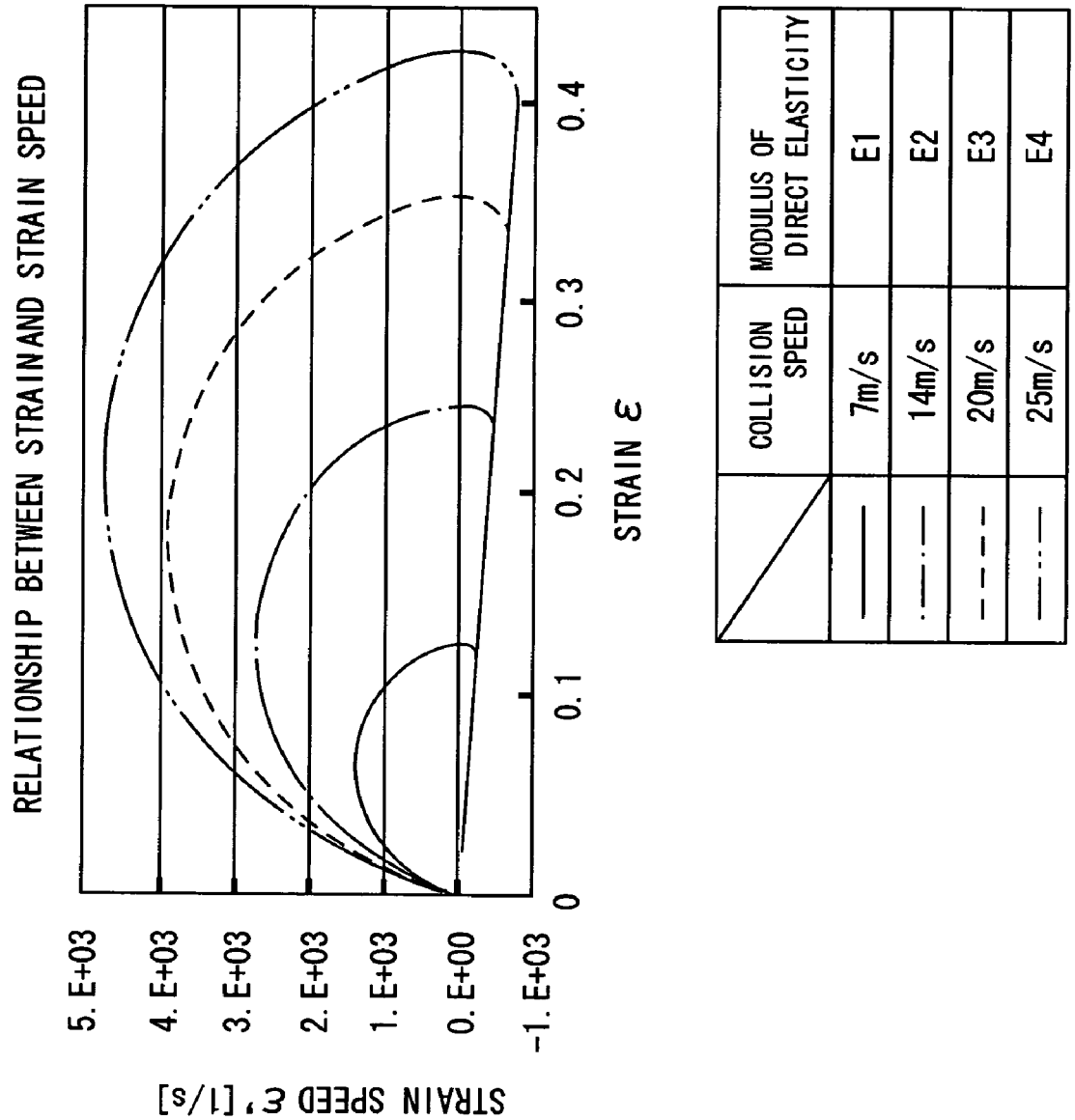
FIG. 17 shows the relationship between the strain and the viscous drag in the second mode of the present invention.

Based on a set condition similar to that of the first mode of the present invention, the relationship among the strain, the strain speed, the rigidity such as the modulus of longitudinal elasticity, and the viscous drag and the data of the golf ball model 10 are written as the input data in executing computations for the simulation. When computations are performed, the rigidity of each element such as the modulus of longitudinal elasticity is computed momently, and computations are performed by using the rigidity such as the obtained modulus of longitudinal elasticity. In the simulation of the second mode of the present invention, from time series data of the strain and the strain speed in each of the four patterns different in the measuring condition, the correspondence relationship among the strain, the strain speed, and the modulus of longitudinal elasticity as shown in FIG. 17 is recorded, and the strain, the strain speed, and the modulus of longitudinal elasticity corresponding to the strain as well as the strain speed are written as the input data. In the case of a strain and a strain speed not identical to the data of the strains and the strain speeds measured under the four different measuring conditions, a primary interpolation is performed by using a binary value of the modulus of longitudinal elasticity measured in a condition of a proximate strain and a proximate strain speed.

In FIG. 17, in the negative region of the strain speed $\epsilon'$, the curves measured in the different conditions look as though they overlap each other and have an equal value. However the curves have different strain speeds $\epsilon'$. Thus the modulus of longitudinal elasticity can be determined from a binary value of the strain and the strain speed.

By determining the modulus of longitudinal elasticity of each element in dependence on the strain and the strain speed generated therein, the property of the material in appropriate strain and strain speed conditions is expressed for each element.

The strain and the strain speed of the entire coordinate system generated in each element are resolved into deviation components and volume components. As described above, the viscous drag and the rigidity such as the modulus of longitudinal elasticity are determined for each coordinate axis. Then by using the equations 1, 2, and 3, the stress and the strain of the deviation components are computed in consideration of the viscoelasticity.

The speed of the cylindrical hollow rod model 20 and that of the golf ball 10 before and after the collision therebetween are computed by using a method similar to that of the first mode of the present invention. The restitution coefficient of the golf ball 10 is computed from the speed and weight of each of the cylindrical hollow rod model 20 and the golf ball 10 to estimate the performance of the golf ball 10.

As described above, the strain and the strain speed are resolved into the deviation components and the volume components. By using the main strain and main strain speed of the deviation components resolved into the main strain coordinate system and the main strain speed coordinate system, the viscous drag and the rigidity such as the modulus of longitudinal elasticity are determined for each axis of the main strain coordinate system and the main strain speed coordinate system in such a way that for each element, the viscous drag and the rigidity such as the modulus of longitudinal elasticity are variable for three components in the direction of each axis. Therefore it is possible to make a correct analysis in a three-dimensional direction in consideration of the viscoelasticity of the viscoelastic material and improve the simulation precision. It is also possible to compute a loss coefficient (tan $\delta$).

Therefore in a condition equivalent to a condition in which a golf ball is hit with an actual golf club head, it is possible to correctly apprehend the performance of the golf ball model composed of the viscoelastic material such as the restitution coefficient and dynamic behavior without making the golf ball as an experiment.

Figure 18:
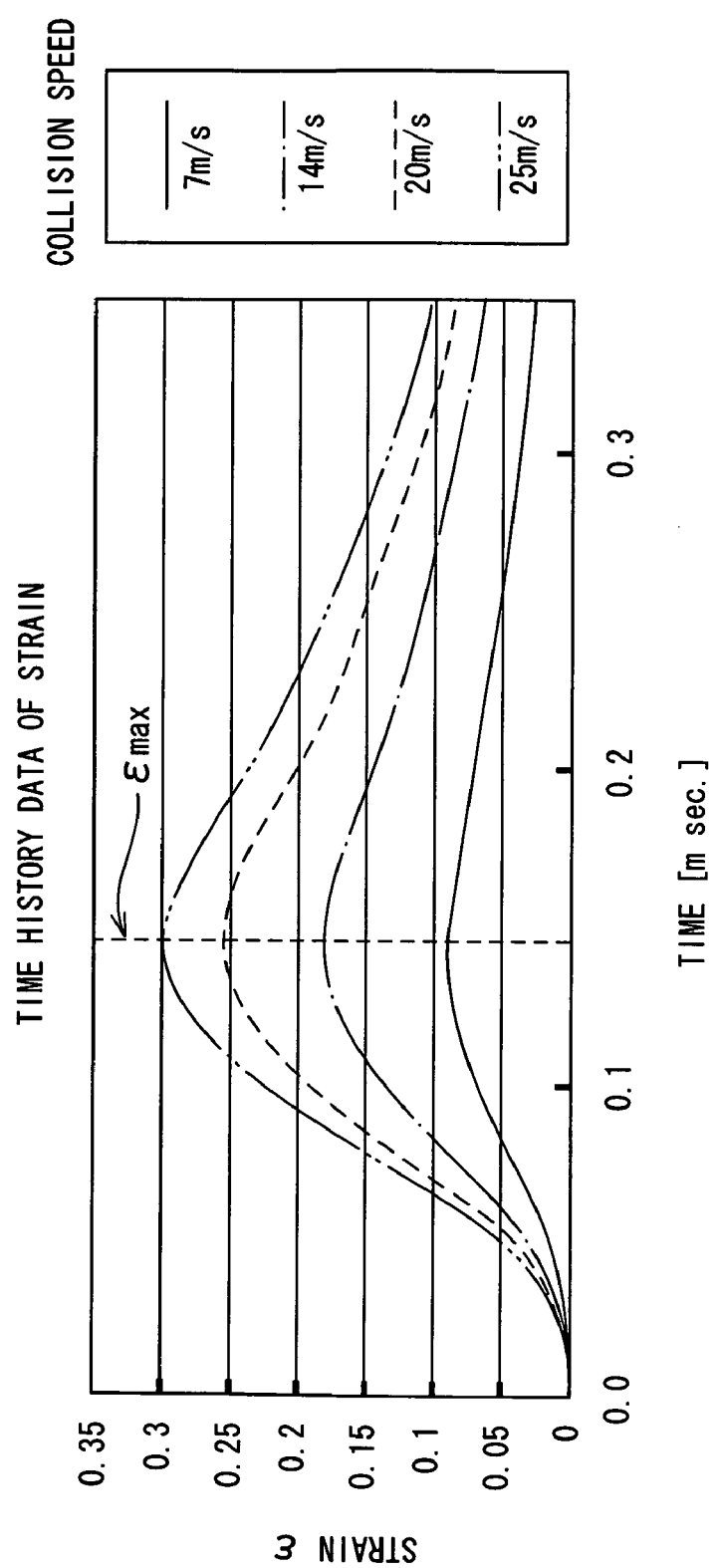
FIG. 18 shows time history data of a strain $\epsilon$ in a third mode of the present invention of the present invention.
Figure 19:
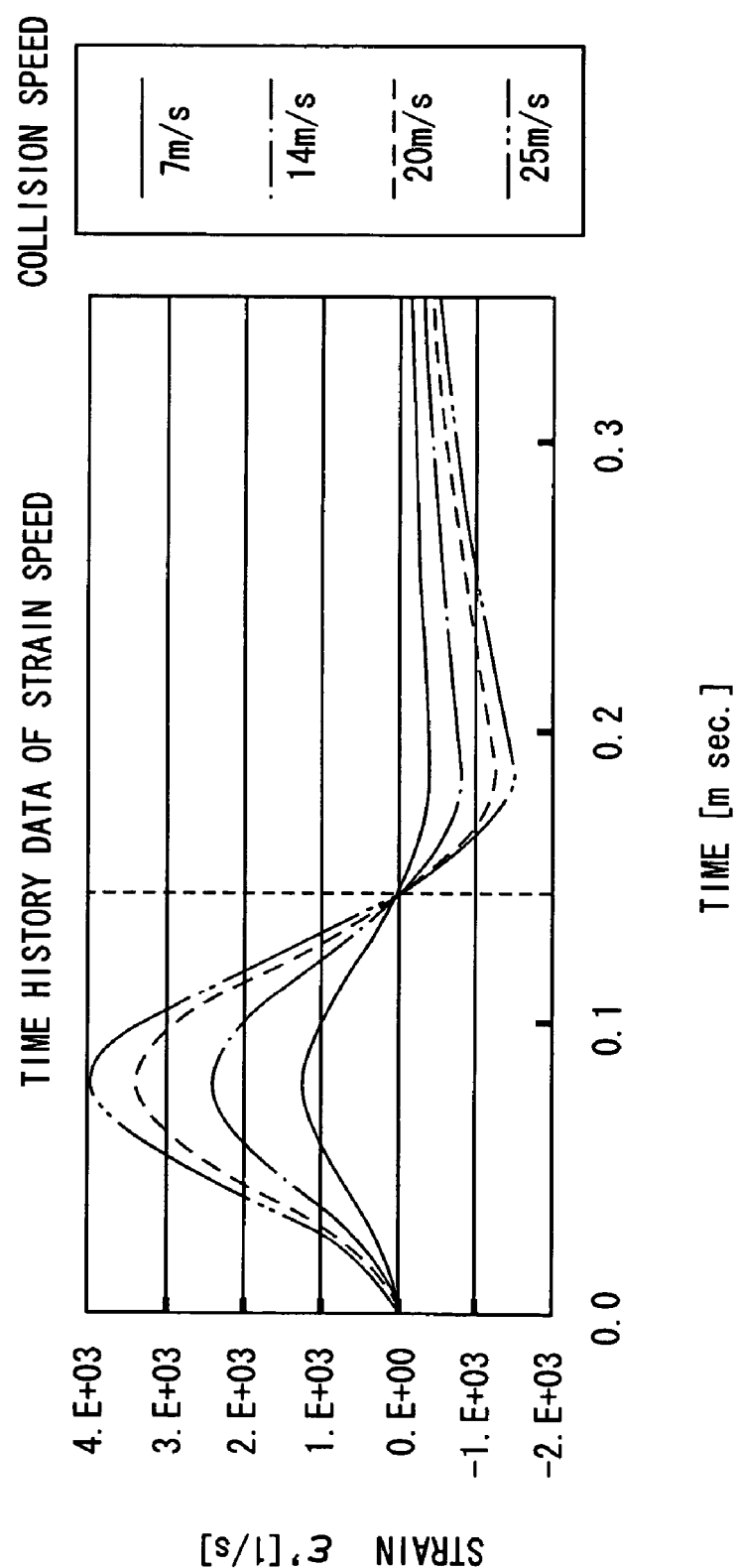
FIG. 19 shows time history data of a strain speed $\epsilon'$ in the third mode of the present invention.
Figure 20:
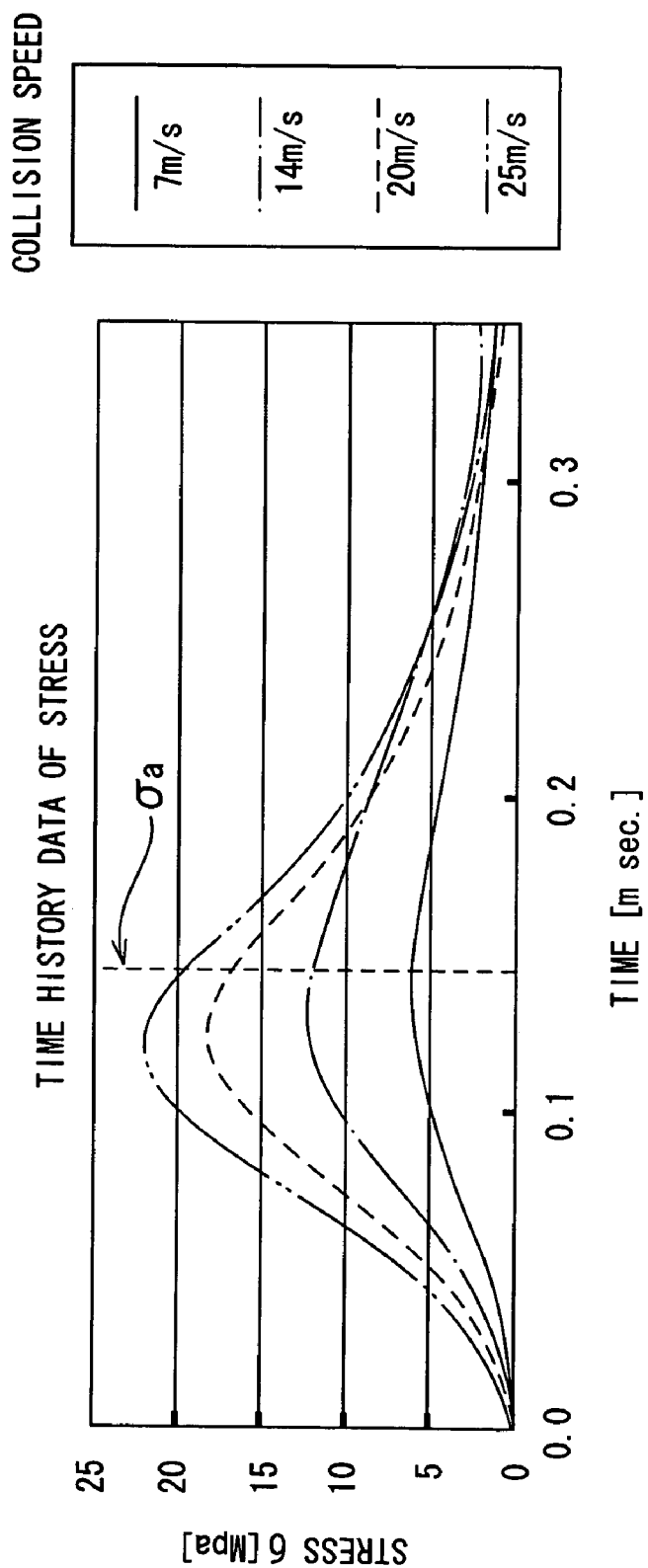
FIG. 20 shows time history data of a stress $\sigma$ in the third mode of the present invention.

Similarly to the first mode of the present invention, in the simulation method of the third mode of the present invention, the value of each of a strain, a strain speed, and a stress generated in a material containing butadiene rubber as its main component is measured momently. FIGS. 18, 19, and 20 show time history data of each of the strain $\epsilon$, the strain speed $\epsilon'$, and the stress $\sigma$ at each collision pattern respectively.

As shown in FIG. 18, when a hitting rod collides with the material by using the split Hopkinson rod testing machine, the material containing the butadiene rubber as its main component generates a strain. The value of the strain increases in a certain period of time and then decreases gently. As shown in FIG. 19, the strain speed shows positive values until the strain attains a maximum value, and then shows negative values. As shown in FIG. 20, the value of the stress changes with the elapse of time.

Figure 21:
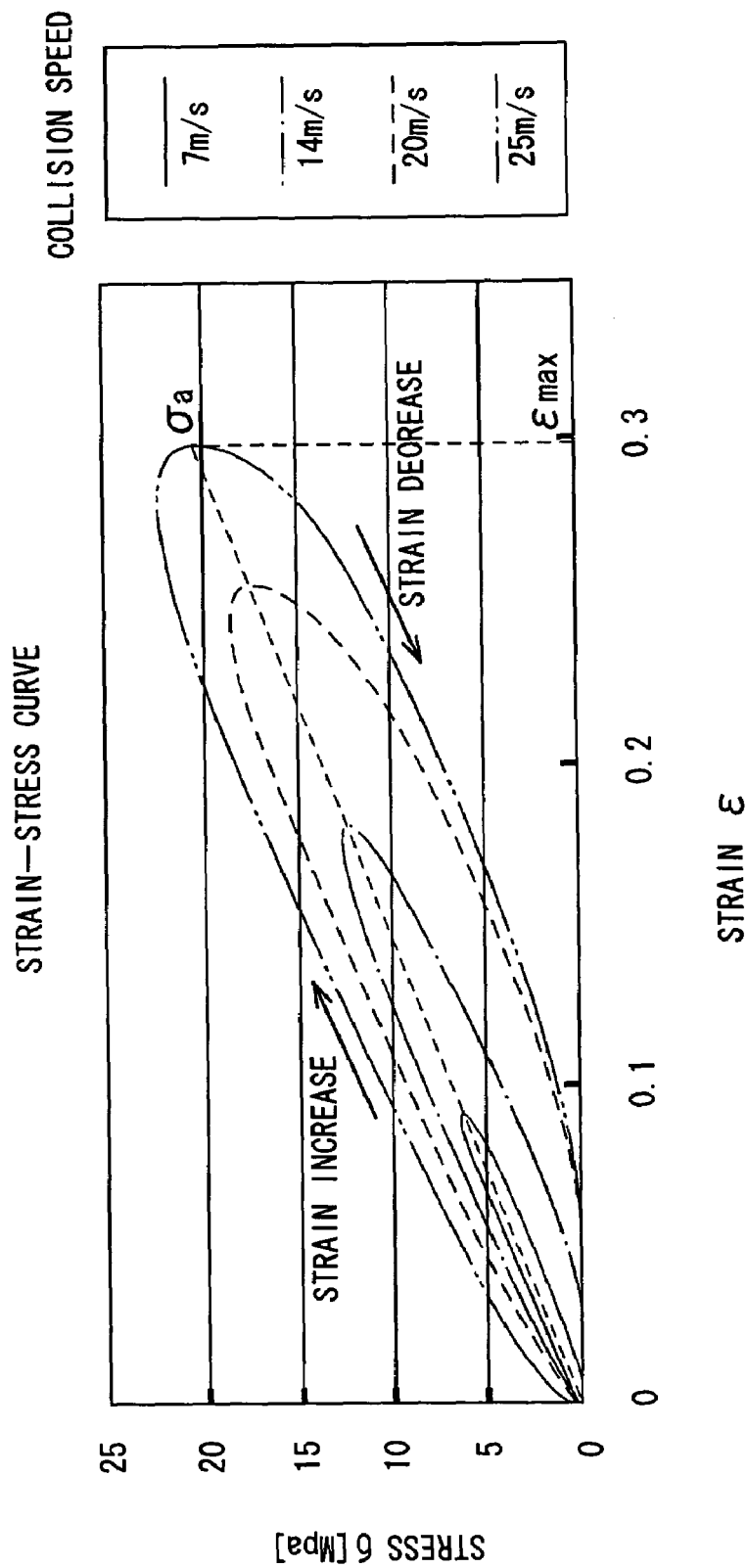
FIG. 21 shows a strain-stress curve and a method of computing a modulus of longitudinal elasticity in the third mode of the present invention.

FIG. 21 shows a strain-stress curve drawn on the basis of the time history data of the strain and the stress. In the strain-stress curve of FIG. 21, the modulus of longitudinal elasticity E of a specimen is computed at each of the collision patterns by using a maximum strain value $\epsilon_{max}$ and a stress value $\sigma_a$ corresponding to the maximum strain value $\epsilon_{max}$ and the above-described equation (4).

Similarly to the first mode of the present invention, in the third mode of the present invention, a viscoelastic model consisting of a spring and a dashpot as shown in FIG. 5 is used to find the viscous drag $\eta$ from the equations (2) and (3).

Figure 22:
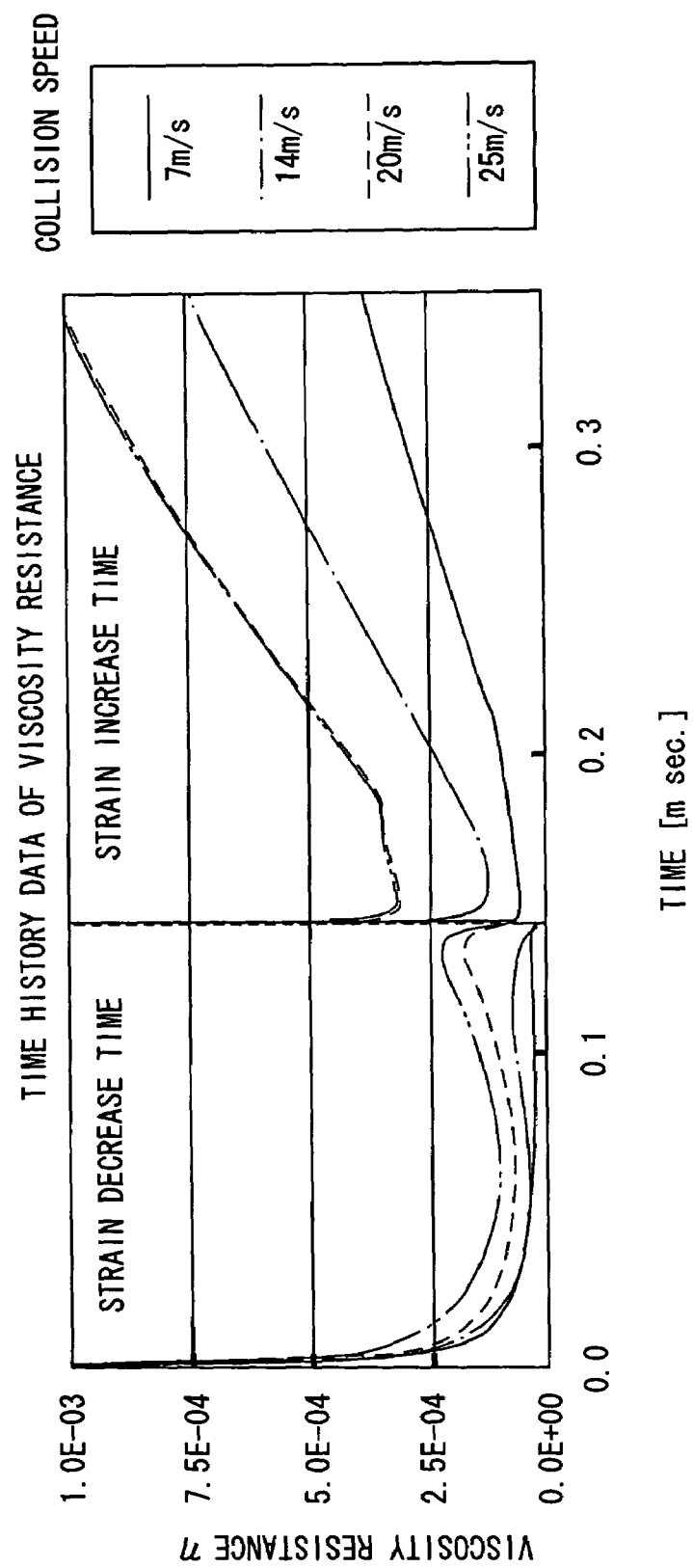
FIG. 22 shows time history data of a viscous drag in the third mode of the present invention.

Therefore from the time history data of the strain $\epsilon$, the strain speed $\epsilon'$, and the stress $\sigma$ shown in FIGS. 18, 19, and 20 respectively and the equation (3), the viscous drag $\eta$ corresponding to the strain $\epsilon$ as well as the strain speed $\epsilon'$ can be computed momently. As described above, the value of each of the strain, the strain speed, and the stress changes with the elapse of time. The state of the strain generated in the viscoelastic material can be divided into a "strain increase state" in which the applied strain increases in a compression direction and a "strain restoration state" in which a compression amount decreases gradually. Therefore the viscous drag is computed separately in the case where the stress generated in the viscoelastic material is in the strain increase state and the case where the stress generated therein is in the strain decrease state (or strain restoration state) to obtain the time history data of the viscous drag at each of the collision speeds, as shown in FIG. 22.

Based on the strain and the stress obtained by the measurement conducted under the condition of a high speed and a great deformation, the modulus of longitudinal elasticity E of the viscoelastic material is determined. Then by using the equation (6) derived from the viscoelastic model in which the viscosity is taken into consideration, the viscous drag η of the viscoelastic material is computed separately in the strain increase state and the strain decrease state (or strain restoration state). The viscous drag η different between the strain increase state and in the strain decrease state are applied to the simulation.

Figure 23:
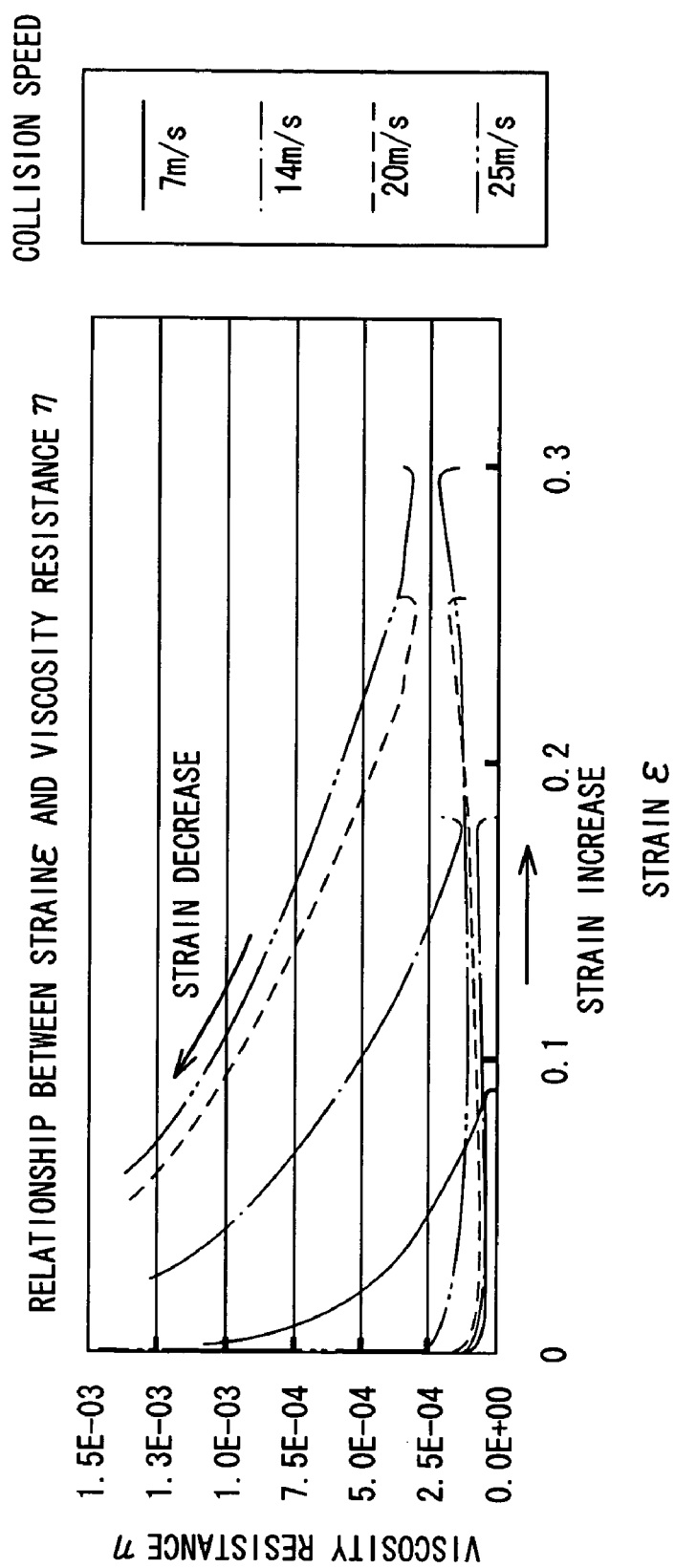
FIG. 23 shows the relationship between the strain and the viscous drag in the third mode of the present invention.
Figure 24:
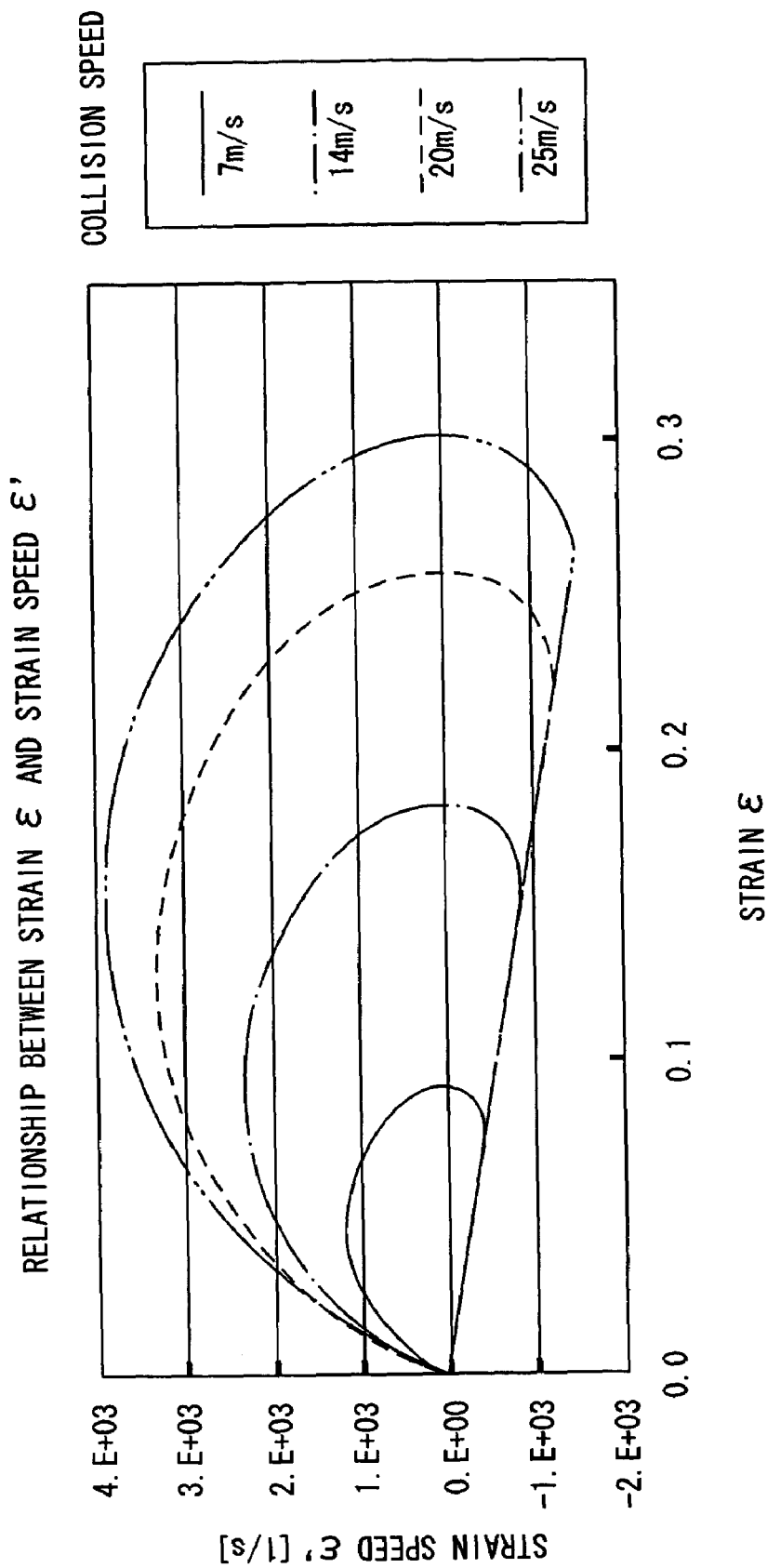
FIG. 24 shows the relationship between the strain and the strain speed in the third mode of the present invention.

FIG. 23 shows the relationship between the strain and the viscous drag obtained from the time history data of the strain and that of the viscous drag. As shown in FIG. 23, at an equal value of the strain, the value of the viscous drag in the strain increase state is different from the value thereof in the strain decrease state (or strain restoration state). FIG. 24 shows the relationship between the strain and the strain speed obtained from the time history data of the strain and that of the strain speed. As shown in FIG. 24, the viscous drag changes in dependence on variations of the strain and the strain speed and is different between the strain increase state and the strain decrease state (or strain restoration state). Thus the viscous drag can be determined in dependence on the strain and the strain speed. The viscous drag is the function of the strain and the strain speed in each of the strain increase state and the strain decrease state. In FIG. 24, the data of the four different collision speeds look as though they overlap each other linearly in the negative region of the strain speed. However the actual values of the strain and those of the strain speed at the four different collision speeds are different from each other respectively.

The simulation is conducted by writing the relationship between the strain and the viscous drag shown in FIG. 23 and the relationship between the strain and the strain speed shown in FIG. 24 as input data at each collision speed, as will be described later and by executing an analysis based on the finite element method in consideration of a variation of the viscous drag in dependence on the difference in the strain and the strain speed, namely, the difference in the viscous drag between the strain increase state and the strain decrease state (or strain restoration state).

Similarly to the first mode of the present invention, in the third mode of the present invention, a one-piece ball containing the butadiene rubber as its main component is set as a product model composed of the viscoelastic material to conduct a simulation, assuming that a golf club head (hitting object) collides with the golf ball.

Based on a set condition similar to that of the first mode of the present invention, the data of the golf ball model 10 and the relationship among the strain, the strain speed, and the viscous drag are written as the input data in computations to be performed for the simulation. When computations are executed, an appropriate viscous drag is computed for each element momently from the equations, and computations of the equations are performed by using the viscous drags. In the simulation, two-dimensional data of the relationship between the strain and the strain speed and the relationship between the strain and the viscous drag in the strain increase state and the strain decrease state (or strain restoration state) are separately inputted to perform computations. From time series data of the strain and the strain speed in each of the four patterns different in the measuring condition, the correspondence relationship between the strain and the strain speed is recorded, and the strain, the strain speed, and the viscous drag corresponding to the strain as well as the strain speed are written as the input data. In the case of a strain and a strain speed not identical to the data of the strains and the strain speeds measured under the four different measuring conditions, a primary interpolation is performed by using a binary value of the modulus of longitudinal elasticity measured in a condition of a proximate strain and a proximate strain speed.

More specifically, when attention is paid to one element, the magnitude (norm) of the element is computed, and a computed norm is compared with a norm of a previous step in the simulation. If there is an increase in the norm, it is determined that the strain is in the increase state. If there is a decrease in the norm, it is determined that the strain is in the decrease state. By determining on whether the strain is in the increase state or the decrease state, the information of the strain and the strain speed is obtained in consideration of the state of the material. Thereafter based on the relationship between the strain and the strain speed obtained from measurement in each collision case (measurement case) and with reference to the value of the strain speed when the strain having an equal value is generated in each collision case, two collision cases each having the value of the strain speed close to the value of the strain speed of the attention-given element are searched. By using the value of each of the strain speed and the viscous drag when the values of the strains corresponding to the strain speeds of the two collision cases are equal to each other, the interpolation is performed to compute an appropriate value of the viscous drag corresponding to the strain and the strain speed generated in the attention-given element. That is, in the third mode of the present invention, the simple primary interpolation is performed. By determining different viscous drags of each element in the strain increase state and the strain decrease state in dependence on the strain and the strain speed generated therein, the property of the material in an appropriate condition of the strain and the strain speed is expressed for each element.

The strain and the strain speed of the entire coordinate system generated in each element are resolved into deviation components and volume components. As described above, for strains having an equal value, the viscous drag different between the strain increase state and the strain decrease state or the strain restoration state is determined for each coordinate axis. Then from the equations 1, 2, and 3, the stress and the strain of the deviation components are computed in consideration of the viscous drag based on the viscous drag.

The speed of the cylindrical hollow rod model 20 and that of the golf ball 10 before and after the collision therebetween are computed by using a method similar to that of the first mode of the present invention. The restitution coefficient of the golf ball 10 is computed from the speed and weight of each of the cylindrical hollow rod model 20 and the golf ball 10 to estimate the performance of the golf ball 10.

As described above, the strain and the strain speed are resolved into the deviation components and the volume components. By using the main strain and main strain speed of the deviation components resolved into the main strain coordinate system and the main strain speed coordinate system respectively, for each axis of the main strain coordinate system and the main strain speed coordinate system, a viscous drag different between the strain increase state and the strain decrease or the strain restoration state is determined for the strain having an equal value in such a way that for each element, the viscous drag is variable for three components in the direction of each axis. Therefore it is possible to make a correct analysis in a three-dimensional direction in consideration of the viscoelasticity of the viscoelastic material and improve the simulation precision. It is also possible to compute a loss coefficient (tan δ).

The simulation is conducted by determining the viscous drag computed separately in the strain increase state and the strain decrease state (or strain restoration state) as the function of the strain and the strain speed, inputting the relationship among the strain, the strain speed, and the viscous drag to the golf ball model, and executing an analysis based on the finite element method. Therefore it is possible to compute the viscous drag corresponding to the strain and the strain speed of each element momently from the strain and the strain speed in consideration of the difference in the viscous drag between the strain increase state and the strain decrease state (or strain restoration state) and estimate with very high precision the characteristic of the viscoelastic material having a high nonlinearity in the condition of a high speed and a great deformation.

Therefore in a condition equivalent to a condition in which a golf ball is hit with an actual golf club head, it is possible to correctly apprehend the performance the golf ball model composed of the viscoelastic material such as the restitution coefficient and dynamic behavior thereof without making the golf ball as an experiment.

Figure 25:
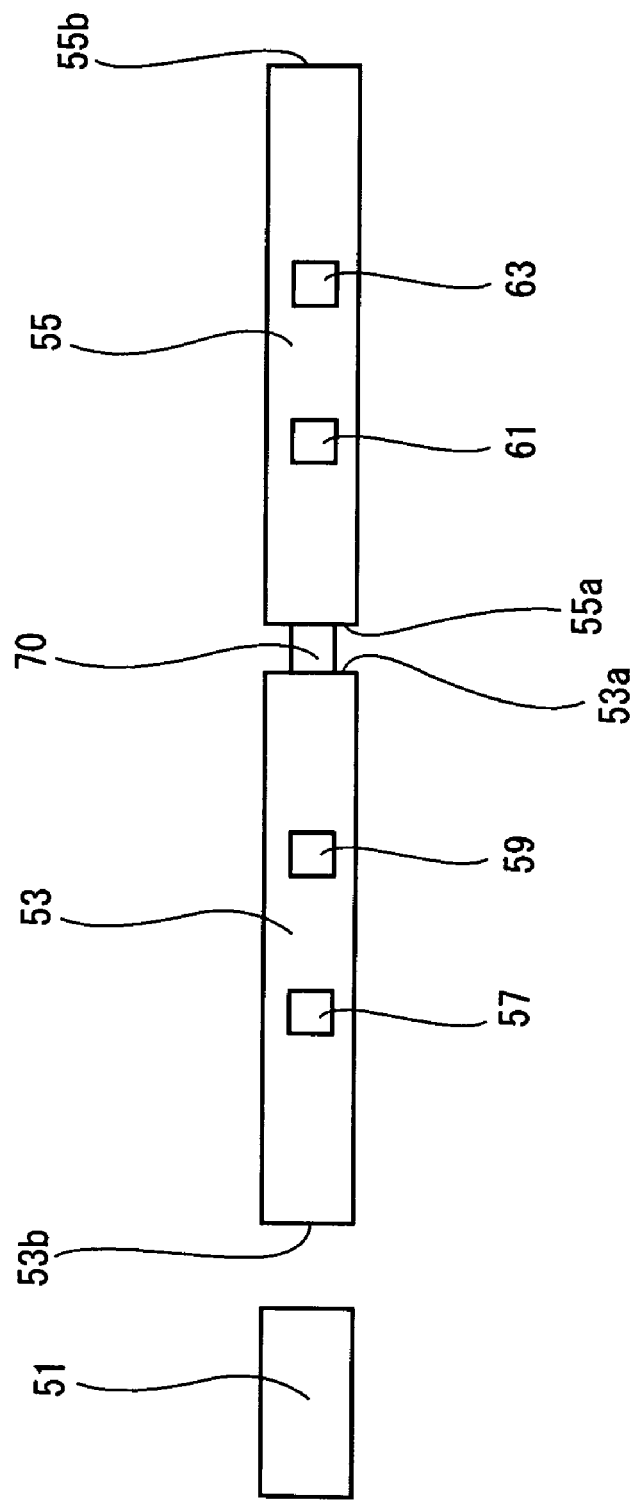
FIG. 25 is an illustrative front view showing a split Hopkinson rod testing machine.

Measurement Conducted by Split Hopkinson Rod Testing Machine to Measure Property of Material FIG. 25 is an illustrative front view showing a split Hopkinson rod testing machine improved in its construction to measure the viscoelastic material.

The split Hopkinson rod testing machine shown in FIG. 25 has a hitting rod 51, an input rod 53, and an output rod 55. These rods are arranged linearly. A first strain gauge 57 and a second strain gauge 59 are installed on the input rod 53. A third strain gauge 61 and a fourth strain gauge 63 are installed on the output rod 55. A columnar specimen 70 is sandwiched between a rear end 53a of the input rod 53 and a front end 55a of the output rod 55.

The specimen 70 may be formed by molding the viscoelastic material into a predetermined configuration or cutting a product composed of the viscoelastic material by molding the viscoelastic material into the predetermined configuration. In the mode of the present invention, the specimen 70 has a length (distance between the rear end 53a of the input rod 53 and the front end 55a of the output rod 55) of 4 mm and a sectional diameter of 18 mm.

The hitting rod 51, the input rod 53, and the output rod 55 are cylindrical and made of polymethyl methacrylate. The sectional diameter of each of the hitting rod 51, the input rod 53 and the output rod 55 is set to 20 mm. The modulus of longitudinal elasticity of each of the hitting rod 51, the input rod 53 and the output rod 55 is set to 5300 Mpa. The specific gravity of each of the hitting rod 51, the input rod 53 and the output rod 55 is set to 1.19. The length of the hitting rod 51 is set to 100 mm. The length of each of the input rod 53 and the output rod 55 (hereinafter may be referred to as stress rod) is set to 2000 mm.

The first strain gauge 57 is installed on the input rod 53 at a position spaced 900 mm from the rear end 53a thereof. The second strain gauge 59 is installed on the input rod 53 at a position spaced 600 mm from the rear end 53a thereof. The third strain gauge 61 is installed on the output rod 55 at a position spaced 300 mm from the front end 55a thereof. The fourth strain gauge 63 is installed on the output rod 55 at a position spaced 600 mm from the front end 55a thereof.

In the split Hopkinson rod testing machine shown in FIG. 25, the hitting rod 51, the input rod 53, and the output rod 55 are made of synthetic resin consisting of polymethyl methacrylate. The input rod 53 and the output rod 55 are as long as 2000 mm. The distance between the first strain gauge 57 and the rear end 53a of the input rod 53 is long. The distance between the second strain gauge 59 and the rear end 53a of the input rod 53 is also long. Therefore, the split Hopkinson rod testing machine is suitable for measuring the strain, the strain speed, and the stress of a viscoelastic material such as crosslinked rubber which is used for a golf ball.

A monoaxial strain gauge for plastic is used as the first strain gauge 57, the second strain gauge 59, the third strain gauge 61, and the fourth strain gauge 63. In the mode of the present invention, a monoaxial strain gauge KFP-5-350-C1-65 manufactured by Kyowa Dengyo Kabushiki Kaisha is used. The monoaxial strain gauge is bonded to the above-described positions of the input rod 53 and the output rod 55. The first strain gauge 57 through the fourth strain gauge 63 are installed on the input rod 53 and the output rod 55 linearly in the longitudinal direction thereof.

In measuring the strain of the specimen, its strain speed, and its stress with the split Hopkinson rod testing machine, initially, the hitting rod 51 is brought into collision with the front end 53b of the input rod 53 at a predetermined speed. Thereby, an incident distorted wave is generated in the input rod 53. The incident distorted wave advances to the rear end 53a of the input rod 53. A part of the incident distorted wave is reflected from the rear end 53a of the input rod 53 to generate a reflected distorted wave. The reflected distorted wave advance to the front end 53b of the input rod 53. A part of the incident distorted wave advances to the specimen 70 from the rear end 53a of the input rod 53 and propagates to the output rod 55 to generate a transmitted distorted wave. The transmitted distorted wave advances to the rear end 55b of the output rod 55.

The incident distorted wave is measured with the first strain gauge 57 and the second strain gauge 59. The incident distorted wave is passed through a low-pass filter to remove a high-frequency wave having a frequency more than 10 KHz from the incident distorted wave. Zero compensation is performed to make the base line value of the time history of the incident distorted wave zero. Fourier transformation of an obtained time base strain at each of the first strain gauge 57 and the second strain gauge 59 is performed to determine a frequency axis strain. A transmission function is derived from the frequency axis strain at the first strain gauge 57 and the second strain gauge 59. Based on the transmission function, the frequency axis strain at the rear end 53a of the input rod 53 is estimated in consideration of the ratio of the distance X1 between the first strain gauge 57 and the rear end 53a of the input rod 53 to the distance X2 between the second strain gauge 59 and the rear end 53a of the input rod 53. Fourier inverse transformation of the frequency axis strain is performed to obtain a time base strain (time history of strain) $\epsilon$ i of the incident distorted wave at the rear end 53a of the input rod 53.

Similarly, the second strain gauge 59 and the first strain gauge 57 measure the reflected distorted wave reflected from the rear end 53a of the input rod 53 and advancing to the front end 53b of the input rod 53. A time base strain (time history of strain) $\epsilon$ r of the reflected distorted wave at the rear end 53a of the input rod 53 is obtained from the measured reflected distorted wave.

The transmitted distorted wave which propagates to the output rod 55 through the specimen 70 is measured with the third strain gauge 61 and the fourth strain gauge 63 installed on the output rod 55. A time base strain (time history of strain) $\epsilon$ t of the transmitted distorted wave at the front end 55a of the output rod 55 is obtained from the measured transmitted distorted wave.

From the obtained time base strains $\epsilon$ i, $\epsilon$ r, and $\epsilon$ t, a strain speed $\epsilon'$ of the specimen 70 is computed by using an equation (9) shown below.

(Equation 9)

$$\varepsilon' = (C_0/L) \cdot (\varepsilon i - \varepsilon r - \varepsilon t) \quad (9)$$
$$= ((E/\rho)^{1/2}/L) \cdot (\varepsilon i - \varepsilon r - \varepsilon t)$$

(In the equation (9), $C_0$ indicates the propagation speed (m/s) of the strain wave in the stress rod and the output rod, L indicates the length (m) of the specimen, E is the modulus of longitudinal elasticity (N/m²) of the stress rod, and $\rho$ is the density (kg/m³) of the stress rod).

From the time base strains $\varepsilon i$, $\varepsilon r$, $\varepsilon t$, the strain $\varepsilon$ of the specimen 70 is computed by using an equation (10) shown below.

(Equation 10)

$$\varepsilon = (CO/L) \cdot \int_0^t (\varepsilon i - \varepsilon r - \dot{\varepsilon} t) dt \quad (10)$$
$$= ((E/\rho)^{1/2}/L) \cdot \int_0^t (\varepsilon i - \varepsilon r - \varepsilon t) dt$$

(In the equation (10), $C_0$ indicates the propagation speed (m/s) of the strain wave in the stress rod and the output rod, L indicates the length (m) of the specimen, E is the modulus of longitudinal elasticity (N/m²) of the stress rod, and $\rho$ is the density (kg/m³) of the stress rod).

From the time base strains $\varepsilon i$, $\varepsilon r$, and $\varepsilon t$, the stress $\sigma$ of the specimen 70 is computed by using an equation (11) shown below.

(Equation 11)

$$\sigma = (E \cdot A/(2As)) \cdot (\varepsilon i + \varepsilon r + \varepsilon t) \quad (11)$$
$$= (E \cdot D^2/(2(Ds)^2)) \cdot (\varepsilon i + \varepsilon r + \varepsilon t)$$

(In the equation 11, E indicates the modulus of longitudinal elasticity (N/m²) of the stress rod consisting of the input rod and the output rod; A indicates the sectional area (m²) of the stress rod; As indicates the sectional area (m²) of the specimen; D indicates the diameter (m) of the stress rod; and Ds indicates the diameter (m) of the specimen.

Figure 26:
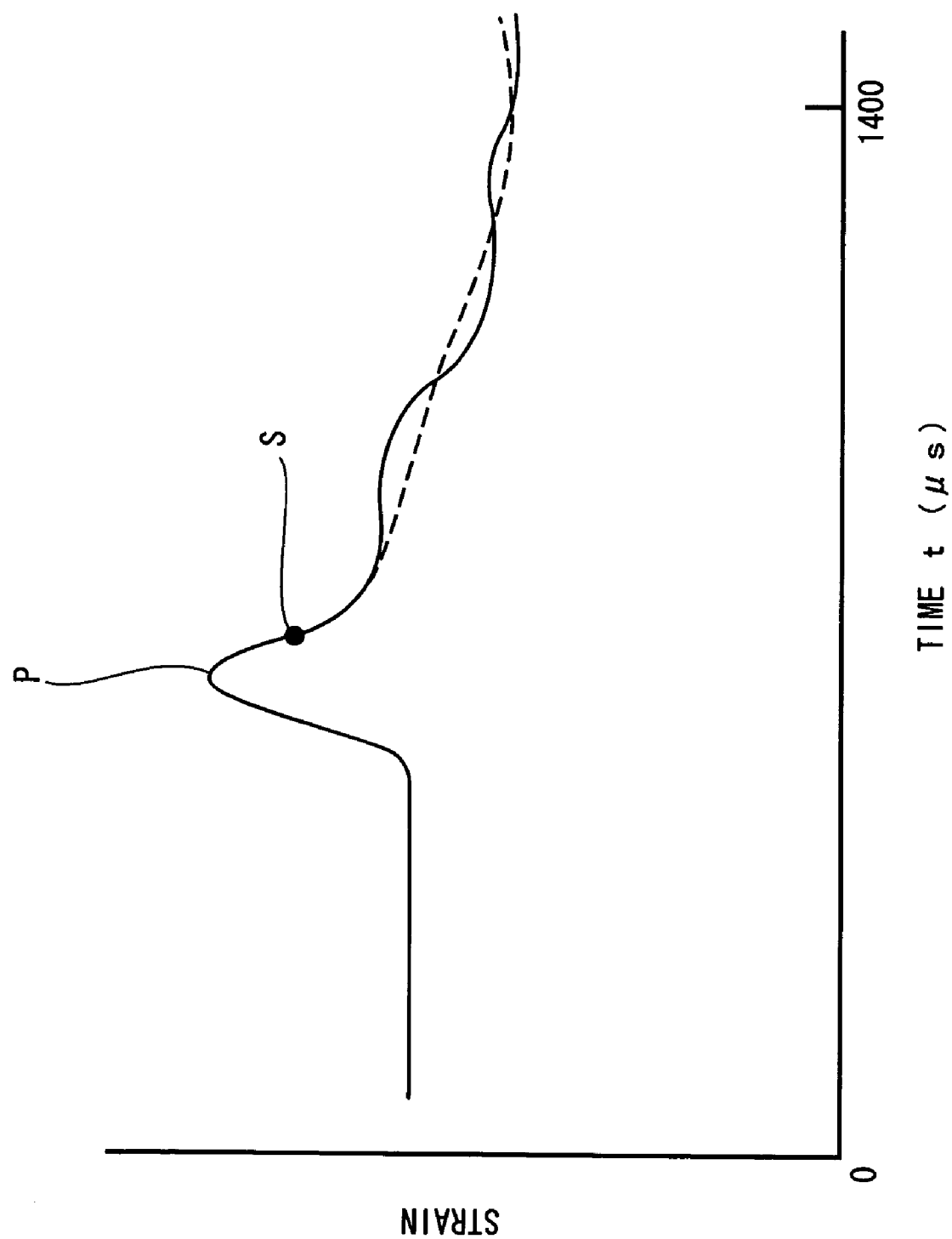
FIG. 26 shows a state of a time history of a strain of a specimen.

FIG. 26 shows the obtained strain time history of the specimen 70. As shown in FIG. 26, the curve is smooth for a certain period of time after a time corresponding to a peak P. After a time corresponding to a given point of the graph FIG. 26, the curve becomes irregular. A point S is selected in the curve-smooth stage between the peak P and the given point. A tangent to the curve at the point S is drawn. A relaxation time $\lambda$ is derived from the intersection of the tangent and the time base. A curve found by using an equation (12) shown below is determined as the curve after the point S of FIG. 26. In this manner, the entire strain time history is corrected to a smooth curve (shown with a one-dot line in FIG. 26). Thereby, it is possible to remove the influence of noise on an obtained viscoelastic characteristic value.

(Equation 12)

$$\epsilon(t) = \epsilon_0 \cdot e^{-t/\lambda} \quad (12)$$

(In the equation 12, $\epsilon_0$ is a strain at the point of contact.)

Similarly, it is possible to make an entire stress time history a smooth curve by using an equation (13) shown below. Thereby, it is possible to remove the influence of noise on an obtained viscoelastic characteristic value.

(Equation 13)

$$\sigma(t) = \sigma_0 \cdot e^{-t/\lambda} \quad (13)$$

(In the equation 13, $\sigma_0$ is a stress at the point of contact.)

As described above, the time history of the strain and the stress of the specimen 70 are corrected.

As the above-described method, by using the split Hopkinson rod testing machine, the time history data of the strain, the strain speed, and the stress at the time the high speed and the great deformation are obtained.

Examples of experiments of the present invention will be described below in detail.

(Experiment 1)

Using a material containing urethane rubber as its main component, a golf ball was prepared. The material was compression-molded in a die having a diameter of 42.8 mm at 160° C. for 30 minutes to form a one-piece golf ball.

The strain, strain speed, and stress of the material containing the urethane rubber as its main component were measured with the split Hopkinson rod testing machine in collision speeds (7 m/s, 14 m/s, 20 m/s, and 25 m/s) of the hitting rod at a room temperature of 23° C. and a relative humidity of 50%.

The maximum strain and the maximum strain speed in the measurement are shown below.

Collision speed 7 m/s (maximum strain: 0.12, maximum strain speed: 1378/s)
Collision speed 14 m/s (maximum strain: 0.24, maximum strain speed: 2703/s)
Collision speed 20 m/s (maximum strain: 0.35, maximum strain speed: 3898/s)
Collision speed 25 m/s (maximum strain: 0.43, maximum strain speed: 4716/s)

Since measurement is made at the four-pattern collision speeds, the phase angle $\delta$ at each of the four collision speeds is shown in table 1 below.

TABLE 1

| | Collision speed of hitting rod (m/s) | | | |
|---|---|---|---|---|
| | 7 | 14 | 20 | 25 |
| Phase angle δ (rad) in experimental result | 0.39 | 0.63 | 1.02 | 1.11 |
| Phase angle δ (rad) of experiment example 1 | 0.36 | 0.58 | 0.98 | 0.99 |
| Phase angle δ (rad) of experiment example 2 | 0.77 | 0.81 | 0.87 | 0.87 |

Experiment Example 1

A simulation was conducted by using the time history data of each of the strain, strain speed, and stress of a specimen, containing urethane rubber as its main component, measured by the split Hopkinson rod testing machine and using a viscoelastic model similar to that of the first mode of the present invention in consideration of the viscous drag. The relationship among the strain, the strain speed, and the modulus of longitudinal elasticity was inputted to the product model used in the simulation method of the first mode of the present invention in consideration of a change of the modulus of longitudinal elasticity which occurs in dependence on a variation of the strain and the strain speed. Further the viscous drag was considered by differentiating the value of the viscous drag between the case where the stress generated in the viscoelastic material is in the strain increase state and the case where the stress generated therein is in the strain decrease state. A software used was a general-purpose software Ls-dyna 940 manufactured by Nippon Sogo Kenkyusho Kabushiki Kaisha.

A phase angle δ estimated by the simulation of the experiment example 1 is shown in table 1.

Experiment Example 2

With reference to the loss coefficient of a specimen composed of a viscoelastic material containing urethane rubber as its main component measured by the split Hopkinson rod testing machine, a simulation was conducted on the conventional viscoelastic material whose viscous drag does not change.

A phase angle δ estimated by the simulation of the experiment example 2 is shown in table 1.

By performing an analysis based on the finite element method, an aluminum hollow rod model having a weight of 200 g (equal to weight of golf club head) collided with a golf ball made of the material containing the urethane rubber as its main component at speeds of 35 m/s, 40 m/s, and 45 m/s to simulate the performance of the golf ball and the deformation state of the material. By performing an analysis based on the finite element method, the restitution coefficient of the golf ball was computed. Table 2 shown below indicates the restitution coefficient of the golf ball, made of the material containing urethane as its main component, obtained by performing an analysis based on the finite element method in the experiment examples 1 and 2.

TABLE 2

| | Initial speed (m/s) of aluminum hollow rod (m/s) | | |
| --- | --- | --- | --- |
| | 35 | 40 | 45 |
| Restitution coefficient (experiment) | 0.63 | 0.60 | 0.56 |
| Restitution coefficient (experiment example 2) | 0.46 | 0.44 | 0.42 |
| Difference from experiment (%) | −27.02 | −25.80 | −24.70 |
| Restitution coefficient (experiment example 1) | 0.60 | 0.56 | 0.53 |
| Difference from experiment (%) | −4.82 | −5.26 | −5.98 |

An experiment was conducted by using an actual golf ball made by molding the material containing urethane as its main component to measure the restitution coefficient of the golf ball by the following method.

Table 2 also shows the difference (%) between the restitution coefficient obtained in the experiment using the following actual golf ball and the restitution coefficients obtained by the analysis made in the experiment examples 1 and 2.

Measurement of Restitution Coefficient in Experiment Conducted by Using Actual Golf Ball As the method of measuring the restitution coefficient of the golf ball, an aluminum hollow rod serving as a substitution of a golf club head and having a weight of 200 g (equal to weight of golf club head) collided with a golf ball made of the above-described material at speeds of 35, 40, and 45 m/s at a temperature of 23° C. The speed of the hollow rod and that of the golf ball before and after the collision therebetween were measured. The restitution coefficient of the golf ball was computed from the speed and weight of the hollow rod and the golf ball.

The collision surface of the hollow rod was flat. The hollow rod collided head-on with the golf ball. Since the hollow rod was not cornered like the golf club head, the golf ball did not rotate when both collided with each other. Thus only the restitution coefficient of the golf ball could be evaluated.

As shown in table 1, the phase angle δ in the analysis of the experiment example 1 was almost equal to the phase angle δ in the experiment at each collision speed. On the other hand, the phase angle δ in the analysis of the experiment example 2 had a large difference from the phase angle δ in the experiment at each collision speed. It could be confirmed that the experiment example 1 could simulate the result of the experiment with high accuracy.

As shown in table 2, at each of the collision speeds of the hollow rod model, the value of the restitution coefficient in the analysis of the experiment example 1 was close to that computed on the actual golf ball prepared in the experiment. The difference in the restitution coefficient of the experiment example 1 from that of the experimental result of the actual golf ball was −4.82% to −5.98%. This indicates that the experiment example 1 could accurately simulate the experimental result of the actual golf ball. On the other hand, at each collision speed of the hollow rod, the value of the restitution coefficient in the analysis of the experiment example 2 was much different from that computed from the actual golf ball prepared in the experiment. The difference in the restitution coefficient of the experiment example 2 from that of experimental result of the actual golf ball was −24.70% to −27.02%. The simulation of the experiment example 2 was much different from the experimental result.

The above-described result indicates that by conducting the simulation in consideration of the viscous drag, it is possible to accurately estimate the performance of a product composed of the viscoelastic material showing nonlinearity in a condition equivalent to a state in which the product is actually used.

(Experiment 2)

Similarly to the experiment 1, the value of the phase angle δ at each of the four collision speeds was computed for a material containing urethane rubber as its main component. The results are shown in table 3 below.

TABLE 3

| | Collision speed of hitting rod (m/s) | | | |
| --- | --- | --- | --- | --- |
| | 7 | 14 | 20 | 25 |
| Phase angle δ (rad) in experimental result | 0.39 | 0.63 | 1.02 | 1.11 |
| Phase angle δ (rad) of experiment example 3 | 0.36 | 0.58 | 0.98 | 0.99 |
| Phase angle δ (rad) of experiment example 4 | 0.45 | 0.77 | 1.06 | 0.99 |

Experiment Example 3

The strain, strain speed, and stress of a specimen containing urethane rubber as its main component were measured by the split Hopkinson rod testing machine. A simulation was conducted by using the time history data of each of the measured strain, strain speed, and stress of the material and a viscoelastic model similar to that of the first mode of the present invention in consideration of a change of the viscous drag and the rigidity such as the modulus of longitudinal elasticity. The relationship among the strain, the strain speed, and the rigidity such as the modulus of longitudinal elasticity was inputted to the product model used in the simulation method of the first mode of the present invention in consideration of a change of the rigidity such as the modulus of longitudinal elasticity which occurs in dependence on a variation of the strain and the strain speed. Further the viscous drag was considered by differentiating the value of the viscous drag between the case where the stress generated in the viscoelastic material is in the strain increase state and the case where the stress generated therein is in the strain decrease state.

The phase angle δ estimated by the simulation of the experiment example 3 is shown in table 3.

Experiment Example 4

Time history data of each of the strain, strain speed, and stress of a specimen containing urethane rubber as its main component measured by the split Hopkinson rod testing machine was used. A simulation was conducted by using the measured strain, strain speed, and stress, with the rigidity constant at 25 m/s. The experiment example 4 was similar to the experiment example 3 except the above-described points.

The phase angle δ estimated by the simulation of the experiment example 4 is shown in table 3.

Similarly to the experiment 1, the restitution coefficient of a golf ball was computed by making an analysis thereof. Table 4 shown below indicates the restitution coefficient of the golf ball, made of the material containing urethane as its main component, obtained by performing analyses in the experiment examples 3 and 4.

TABLE 4

|  | Initial speed (m/s) of aluminum hollow rod (m/s) | | |
| --- | --- | --- | --- |
|  | 35 | 40 | 45 |
| Restitution coefficient (experiment) | 0.63 | 0.6 | 0.56 |
| Restitution coefficient (experiment example 4) | 0.53 | 0.48 | 0.41 |
| Difference from experiment (%) | −15.8 | −20 | −19.6 |
| Restitution coefficient (experiment example 3) | 0.6 | 0.56 | 0.53 |
| Difference from experiment (%) | −4.82 | −5.26 | −5.98 |

Similarly to the experiment 1, the value of the restitution coefficient of an actual golf ball was measured. Table 4 shows the difference (%) between the restitution coefficient obtained by the analysis in the experiment examples 3 and 4 and the restitution coefficient obtained in the experiment in which the actual golf ball was used.

As shown in table 3, the phase angle δ obtained by the analysis of the experiment example 3 was almost equal to the phase angle δ obtained in the experiment. On the other hand, the phase angle δ obtained by the analysis of the experiment example 4 had a difference from the phase angle δ obtained in the experiment at each collision speed. Since the rigidity was determined at 25 m/s, the rigidity was lower than the actual value. Therefore it could be confirmed that the experiment example 3 simulated the experimental result with high accuracy. More specifically, at the collision speeds of 7, 14, and 20 m/s, the restitution coefficient was computed at a lower rigidity than the actual value in the experiment example 4, and the viscous drag was not changed. Thus the phase angle deviated in a larger direction.

As shown in table 4, at each of the collision speeds of the hollow rod model, the value of the restitution coefficient in the analysis of the experiment example 3 was close to that computed on the actual golf ball prepared in the experiment. The difference in the restitution coefficient of the experiment example 3 from that of the experimental result of the actual golf ball was −4.82% to −5.98%. This indicates that the experiment example 3 could accurately simulate the result of the actual golf ball. On the other hand, at each collision speed of the hollow rod, the value of the restitution coefficient in the analysis of the experiment example 4 was much different from that computed from the actual golf ball prepared in the experiment. The difference in the restitution coefficient of the experiment example 4 from that of experimental result of the actual golf ball was −15.80% to 20.0%. Compared with the experiment example 3, the simulation of the experiment example 4 was much different from the experimental result.

The above-described result indicates that by conducting the simulation in consideration of the viscous drag and the rigidity such as the modulus of longitudinal elasticity, it is possible to accurately estimate the performance of the product composed of the viscoelastic material which shows nonlinearity and in particular, the product composed of the viscoelastic material whose rigidity such as the modulus of longitudinal elasticity changes in dependence on a deformation state (magnitude of strain and strain speed) of the material in a condition equivalent to a state in which the product is actually used.

(Experiment 3)

Similarly to the experiment 1, the value of the phase angle δ at each of the four collision speeds was computed for a material containing urethane rubber as its main component. The results are shown in table 5 below.

TABLE 5

|  | Collision speed of hitting rod (m/s) | | | |
| --- | --- | --- | --- | --- |
|  | 7 | 14 | 20 | 25 |
| Phase angle δ (rad) in experimental result | 0.39 | 0.63 | 1.02 | 1.11 |
| Phase angle δ (rad) of experiment example 5 | 0.36 | 0.58 | 0.98 | 0.99 |
| Phase angle δ (rad) of experiment example 6 | 0.32 | 0.53 | 0.79 | 0.85 |

Experiment Example 5

A simulation was conducted by using time history data of each of the strain, strain speed, and stress of a specimen, containing urethane rubber as its main component, measured by the split Hopkinson rod testing machine and using a viscoelastic model similar to that of the third mode of the present invention in consideration of the viscous drag different between the strain increase state and the strain decrease state or the strain restoration state. In the simulation method of the third mode of the present invention, the relationship among the strain, the strain speed, and the rigidity such as the modulus of longitudinal elasticity was inputted to the product model in consideration of a change of the modulus of longitudinal elasticity which occurs in dependence on a variation of the strain and the strain speed.

A software used was a general-purpose software Ls-dyna 940 manufactured by Nippon Sogo Kenkyusho Kabushiki Kaisha.

The phase angle δ estimated by the simulation of the experiment example 5 is shown in table 5.

Experiment Example 6

Time history data of each of the strain, strain speed, and stress of a specimen containing urethane rubber as its main component measured by the split Hopkinson rod testing machine was used. A simulation was conducted by making the modulus of longitudinal elasticity variable and utilizing the strain and the strain speed and the viscous drag in the strain increase state. The experiment example 6 was similar to the experiment example 5 except the above-described points.

The phase angle δ estimated by the simulation of the experiment example δ is shown in above table 5.

Similarly to the experiment example 1, the restitution coefficient of a golf ball was computed by making an analysis thereof. Table 6 shown below indicates the restitution coefficient of the golf ball, made of the material containing urethane as its main component, obtained by performing analyses in the experiment examples 5 and 6.

TABLE 6

| | Initial speed (m/s) of aluminum hollow rod (m/s) | | |
|---|---|---|---|
| | 35 | 40 | 45 |
| Restitution coefficient (experiment) | 0.63 | 0.6 | 0.56 |
| Restitution coefficient (experiment example 6) | 0.77 | 0.71 | 0.65 |
| Difference from experiment (%) | 22.2 | 18.3 | 16.1 |
| Restitution coefficient (experiment example 5) | 0.6 | 0.56 | 0.53 |
| Difference from experiment (%) | −4.82 | −5.26 | −5.98 |

Similarly to the experiment 1, the value of the restitution coefficient of an actual golf ball was measured. Table 6 shows the difference (%) between the restitution coefficient obtained by analyses in the experiment examples 5 and 6 and the restitution coefficient obtained in an experiment in which the actual golf ball was used.

As shown in table 5, the phase angle δ obtained by the analysis of the experiment example 5 was almost equal to the phase angle δ obtained in the experiment at each collision speed. On the other hand, because simulation of the experiment example 6 was conducted in the strain increase state and by using a curve of the strain increase state, the energy loss was lower than that of the experiment example 5 in the stress-strain curve. Thus the phase angle δ obtained by the analysis of the experiment example 6 was smaller than that of the experiment example 5 at each collision speed. The phase angle δ obtained by the analysis of the experiment example 6 was also smaller than that of the experimental result and thus had a large difference from that of the experimental result. Therefore it could be confirmed that the experiment example 5 simulated the experimental result with high accuracy.

As shown in table 6, at each of the collision speeds of the hollow rod model, the value of the restitution coefficient in the analysis of the experiment example 5 was close to that computed on the actual golf ball prepared in the experiment. The difference in the restitution coefficient of the experiment example 5 from that of the experimental result of the actual golf ball was −4.82% to −5.98%. This indicates that the experiment example 5 could accurately simulate the result of the actual golf ball. On the other hand, the value of the restitution coefficient in the analysis of the experiment example 6 was greater than that of the experiment since the value of the phase angle δ was small and had a large difference from that of the experiment example 5. The difference in the restitution coefficient of the experiment example 6 from that of experimental result of the actual golf ball was 16.1% to 22.2%.

As apparent from the foregoing description, it could be confirmed that since the simulation is conducted in both the strain increase state and the strain decrease or the strain restoration state in consideration of the difference in the viscous drag between the strain increase state and the strain decrease or the strain restoration state, it is possible to accurately estimate the performance of the product composed of the viscoelastic material showing nonlinearity in the condition equivalent to the state in which the product is actually used.

INDUSTRIAL APPLICABILITY

As apparent from the foregoing description, according to the first invention, to consider the viscoelastic characteristic in the deviation components of the strain and the strain speed generated in each element, the strain and the strain speed are resolved into the deviation components and the volume components. Then by using the main strain and the main strain speed of the deviation components converted into the main strain coordinate system and the main strain speed coordinate system, the viscous drag is determined for the coordinate axis of each of the main strain coordinate system and the main strain speed coordinate system in such a way that for each element, the viscous drag is variable for three components in the direction of each axis. Therefore it is possible to make a correct analysis of a three-dimensional direction in consideration of the viscoelasticity of the viscoelastic material and improve the simulation precision.

Further, using the viscoelastic model in which the viscosity of the viscoelastic material is considered, the simulation is conducted by deriving the viscous drag of the viscoelastic material and inputting the relationship among the strain, the strain speed, and the viscous drag to the product model. Therefore it is possible to accurately express a phenomenon that the property of the viscoelastic material changes nonlinearly in dependence on its deformation speed and magnitude.

In the second invention, to consider the viscoelastic characteristic in the deviation components of the strain and the strain speed generated in each element, the strain and the strain speed are resolved into the deviation components and the volume components. Then by using the main strain and the main strain speed of the deviation components converted into the main strain coordinate system and the main strain speed coordinate system respectively, the viscous drag is determined for the coordinate axis of each of the main strain coordinate system and the main strain speed coordinate system in such a way that for each element, the viscous drag is variable for three components in the direction of each axis. Therefore it is possible to make a correct analysis of a three-dimensional direction in consideration of the viscoelasticity of the viscoelastic material and improve the simulation precision.

Further the rigidity such as the modulus of longitudinal elasticity of the viscoelastic material which changes in dependence on a variation of the state of the material is computed from the time history data of the strain and the stress obtained from measurement to conduct a simulation in consideration of the change of the rigidity such as the modulus of longitudinal elasticity corresponding to a variation of the strain and the strain speed. Therefore it is possible to accurately express the phenomenon that the property of the viscoelastic material changes nonlinearly in dependence on its deformation speed and magnitude.

In the third invention, to consider the viscoelastic characteristic in the deviation components of the strain and the strain speed generated in each element, the strain and the strain are resolved into the deviation components and the volume components. Then by using the main strain and the main strain speed of the deviation components converted into the main strain coordinate system and the main strain speed coordinate system respectively, the viscous drag is determined for the coordinate axis of each of the main strain coordinate system and the main strain speed coordinate system in such a way that for each element, the viscous drag is variable for three components in the direction of each axis. Therefore it is possible to make a correct analysis of a three-dimensional direction in consideration of the viscoelasticity of the viscoelastic material and improve the simulation precision.

Using the viscoelastic model in which the viscosity of the viscoelastic material is considered, the simulation is conducted by deriving the viscous drag of the viscoelastic material separately in the strain increase state and the strain decrease state or the strain restoration state and inputting the relationship among the strain, the strain speed, and the viscous drag different between the strain increase state and the strain decrease state or the strain restoration state to the product model. Therefore it is possible to accurately grasp the actual state of the material and express the phenomenon that the property of the viscoelastic material changes nonlinearly in dependence on its deformation speed and magnitude.

Further according to the first, second, and third inventions, because the value of each of the strain, the strain speed, and the stress is measured in a measuring condition equivalent to a state in which the product composed of the viscoelastic material is actually used, it is possible to conduct the simulation in correspondence to various deformation states of the viscoelastic material.

Accordingly it is possible to accurately analyze the performance and the dynamic behavior of the product composed of the viscoelastic material in which the relationship between the strain and the strain speed changes in dependence on a deformation state and whose property such as a loss coefficient shows nonlinearity.

The simulation method is capable of accurately estimating an actual hitting test in the condition of the strain and the strain speed equivalent to those generated in the viscoelastic material of an actual golf ball when it is actually hit with the golf club head. Therefore the simulation method is capable of accurately estimating the performance and deformation behavior of the golf ball model in a state close to an actual hitting state. Thereby the simulation method is capable of easily apprehending the property of the material which determines the performance of the golf ball, thus contributing to the improvement of the product and reducing the number of trial manufactures of the golf ball in a designing stage and cost and time required for the trial manufacture.

What is claimed is:

1. A simulation method of estimating performance of a product made of a viscoelastic material, comprising the steps of:
    momently measuring a value of each of a strain, a strain speed, and a stress generated in said viscoelastic material in a measuring condition equivalent to a condition in which said product composed of said viscoelastic material is actually used;
    deriving time history data of a viscous drag of said viscoelastic material from time history data of each of said strain, said strain speed, and said stress and a viscoelastic model in which a viscosity of said viscoelastic material is considered, thereby deriving a relationship among said strain, said strain speed, and said viscous drag;
    in estimating the performance of said product set as a product model whose performance is analyzed and made of said viscoelastic material, said product model is divided into a large number of elements, said relationship is inputted to said product model, and an analysis is executed by a finite element method in consideration of a change of said viscous drag in dependence on a variation of said strain and said strain speed;
    resolving said strain and said strain speed of an entire coordinate system generated in each element into deviation components and volume components, and converting said strain and said strain speed of said deviation components from said entire coordinate system into a main strain coordinate system and a main strain speed coordinate systems respectively; and
    determining a viscous drag for a coordinate axis of each of said main strain coordinate system and said main strain speed coordinate system by using a converted deviation main strain and a converted deviation main strain speed.

2. The simulation method of estimating performance of a product made of a viscoelastic material according to claim 1, wherein said viscoelastic material shows nonlinearity in a property thereof.

3. The simulation method of estimating performance of a product made of a viscoelastic material according to claim 1, wherein a split Hopkinson rod testing machine measures said strain, said strain speed, and said stress.

4. The simulation method of estimating performance of a product made of a viscoelastic material according to claim 1, wherein a maximum value of said strain generated in said viscoelastic material at said measuring time is in a range of 0.05 to 0.50 and/or a maximum value of said strain speed is in a range of 500/s to 10000/s.

5. The simulation method of estimating performance of a product made of a viscoelastic material according to claim 1, wherein said viscoelastic material is used for a golf ball, and said product model is a golf ball.

6. The simulation method of estimating performance of a product made of a viscoelastic material according to claim 5, wherein a phenomenon of a collision between said golf ball and a hitting object assumed to be a golf club head is simulated to estimate a behavior of said golf ball at the time of said collision.

7. A simulation method of estimating performance of a product made of a viscoelastic material, comprising the steps of:
    momently measuring a value of each of a strain, a strain speed, and a stress generated in said product made of a viscoelastic material equivalent to a condition in which said product composed of said viscoelastic material is actually used;

deriving a plurality of different rigidities from time history data of each of said strain and said stress and deriving a correspondence relationship among said strain, said strain speed, and said rigidities, thereby deriving a relationship among said strain, said strain speed, and said rigidities;

in estimating the performance of said product set as a product model whose performance is analyzed and made of a viscoelastic material, said product model is divided into a large number of elements, said relationship is inputted to said product model, and an analysis is executed by a finite element method in consideration of a change of said rigidities in dependence on a variation of said strain and said strain speed;

resolving said strain and said strain speed of an entire coordinate system generated in each element into deviation components and volume components, and converting said strain and said strain speed of said deviation components from said entire coordinate system into a main strain coordinate system and a main strain speed coordinate system, respectively; and determining a rigidity for a coordinate axis of each of said main strain coordinate system and said main strain speed coordinate system by using a converted deviation main strain and a converted deviation main strain speed.

8. The simulation method of estimating performance of a product made of a viscoelastic material according to claim 7, wherein time history data of a viscous drag of said viscoelastic material is derived from time history data of each of said strain, said strain speed, and said stress and a viscoelastic model in which a viscosity of said viscoelastic material is considered; and a change of said rigidity and that of said viscous drag are considered.

9. The simulation method of estimating performance of a product made of a viscoelastic material according to claim 7, wherein said viscoelastic material shows nonlinearity in a property thereof.

10. The simulation method of estimating performance of a product made of a viscoelastic material according to claim 7, wherein a split Hopkinson rod testing machine measures said strain, said strain speed, and said stress.

11. The simulation method of estimating performance of a product made of a viscoelastic material according to claim 7, wherein a maximum value of said strain generated in said viscoelastic material at said measuring time is in a range of 0.05 to 0.50 and/or a maximum value of said strain speed is in a range of 500/s to 10000/s.

12. The simulation method of estimating performance of a product made of a viscoelastic material according to claim 7, wherein said viscoelastic material is used for a golf ball, and said product model is a golf ball.

13. The simulation method of estimating performance of a product made of a viscoelastic material according to claim 12, wherein a phenomenon of a collision between said golf ball and a hitting object assumed to be a golf club head is simulated to estimate a behavior of said golf ball at a time of said collision.

14. A simulation method of estimating performance of a product made of a viscoelastic material, comprising the steps of:

momently measuring a value of each of a strain, a strain speed, and a stress generated in said product made of a viscoelastic material in a measuring condition equivalent to a condition in which said product composed of said viscoelastic material is actually used;

deriving time history data of a viscous drag of said viscoelastic material separately in a strain increase state and a strain decrease state or a strain restoration state from time history data of each of said strain, said strain speed, and said stress and a viscoelastic model in which a viscosity of said viscoelastic material is considered, thereby deriving a relationship among said strain, said strain speed, and said viscous drag;

in estimating the performance of said product set as a product model whose performance is analyzed and made of said viscoelastic material, said product model is divided into a large number of elements, said relationship is inputted to said product model, and an analysis is executed by a finite element method in consideration of a difference in said viscous drag between said strain increase state and said strain decrease state or said strain restoration state;

resolving said strain and said strain speed of an entire coordinate system generated in each element into deviation components and volume components, and converting said strain and said strain speed of said deviation components from said entire coordinate system into a main strain coordinate system and a main strain speed coordinate system, respectively; and determining a viscous drag different between said strain increase state and said strain decrease or said strain restoration state for a coordinate axis of each of said main strain coordinate system and said main strain speed coordinate system when strains having an equal value are generated in said viscoelastic material, by using a converted deviation main strain and a converted deviation main strain speed.

15. The simulation method of estimating performance of a product made of a viscoelastic material according to claim 14, wherein a norm which is the magnitude of a main strain is computed for each of said elements, and said computed norm is compared with a norm of a previous step in a simulation to determine that said main strain is in said increase state when said norm has increased, and to determine that said main strain is in said decrease state when said norm has decreased.

16. The simulation method of estimating performance of a product made of a viscoelastic material according to claim 14, wherein said viscoelastic material shows nonlinearity in a property thereof.

17. The simulation method according to claim 14, wherein a split Hopkinson rod testing machine measures said strain, said strain speed, and said stress.

18. The simulation method according to claim 14, wherein a maximum value of said strain generated in said viscoelastic material at said measuring time is in a range of 0.05 to 0.50 and/or a maximum value of said strain speed is in a range of 500/s to 10000/s.

19. The simulation method according to claim 14, wherein said viscoelastic material is used for a golf ball, and said product model is a golf ball.

20. The simulation method according to claim 19, wherein a phenomenon of a collision between said golf ball and a hitting object assumed to be a golf club head is simulated to estimate a behavior of said golf ball at a time of said collision.

* * * * *